(12) United States Patent
Payne et al.

(10) Patent No.: US 7,315,596 B2
(45) Date of Patent: Jan. 1, 2008

(54) INTERPOLATOR BASED CLOCK AND DATA RECOVERY (CDR) CIRCUIT WITH DIGITALLY PROGRAMMABLE BW AND TRACKING CAPABILITY

(75) Inventors: Robert Floyd Payne, Allen, TX (US); Bharadwaj Parthasarathy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 785 days.

(21) Appl. No.: 10/781,099

(22) Filed: Feb. 17, 2004

(65) Prior Publication Data
US 2005/0180536 A1    Aug. 18, 2005

(51) Int. Cl.
*H04L 7/00* (2006.01)
(52) U.S. Cl. .................................... 375/355
(58) Field of Classification Search ............... 375/354, 375/355, 359, 371, 376; 327/141, 144, 147, 327/149, 156, 158
See application file for complete search history.

(56) References Cited

U.S. PATENT DOCUMENTS

| | | | |
|---|---|---|---|
| 6,114,914 A * | 9/2000 | Mar ........................... | 327/156 |
| 6,901,126 B1 * | 5/2005 | Gu ............................. | 375/355 |
| 7,079,615 B2 * | 7/2006 | Bailey ........................ | 375/376 |
| 7,162,002 B2 * | 1/2007 | Chen et al. ................. | 375/376 |
| 2002/0131539 A1 | 9/2002 | Li et al. | |
| 2003/0212930 A1 | 11/2003 | Aung et al. | |

* cited by examiner

*Primary Examiner*—Betsy L. Deppe
(74) *Attorney, Agent, or Firm*—Alan K. Stewart; W. James Brady; Frederick J. Telecky, Jr.

(57) ABSTRACT

The present invention facilitates clock and data recovery (330,716/718) for serial data streams (317,715) by providing a mechanism that can be employed to maintain a fixed tracking capability of an interpolator based CDR circuit (300,700) at multiple data rates (e.g., 800). The present invention further provides a wide data rate range CDR circuit (300,700), yet uses an interpolator design optimized for a fixed frequency. The invention employs a rate programmable divider circuit (606,656,706) that operates over a wide range of clock and data rates (e.g., 800) to provide various phase correction step sizes (e.g., 800) at a fixed VCO clock frequency. The divider (606,656,706) and a finite state machine (FSM) (612,662,712) of the exemplary CDR circuit (600,650,700) are manually programmed based on the data rate (614,667). Alternately, the data rate may be detected from a recovered serial data stream (718) during CDR operations (on-the-fly) utilizing a frequency detection circuit (725) to automatically program the divider (706) and FSM (712) to provide CDR circuit operation at the nearest base clock rate (716).

19 Claims, 16 Drawing Sheets

| Data Rate (Gbps) | Unit interval (ps) | Steps/ UI | Typical Implementation | | | Proposed Implementation | | |
|---|---|---|---|---|---|---|---|---|
| | | | Latency (bits) | Steps/ Update | Tracking ability (ppm) | Latency (bits) | Steps/ Update | Tracking ability (ppm) |
| 12.5 | 80 | 64 | 32 | 1 | 488 | 32 | 1 | 488 |
| 6.25 | 160 | 128 | 32 | 1 | 244 | 32 | 2 | 488 |
| 3.125 | 320 | 256 | 32 | 1 | 122 | 32 | 4 | 488 |
| 1.5625 | 640 | 512 | 32 | 1 | 61 | 32 | 8 | 488 |
| 1.25 | 800 | 640 | 32 | 1 | 48.8 | 24 | 8 | 521 |

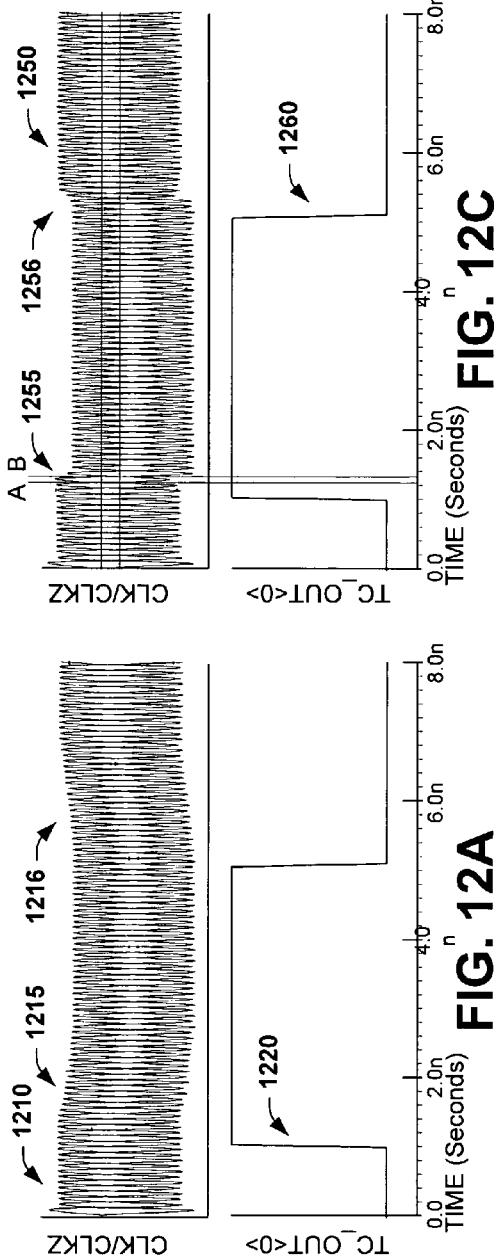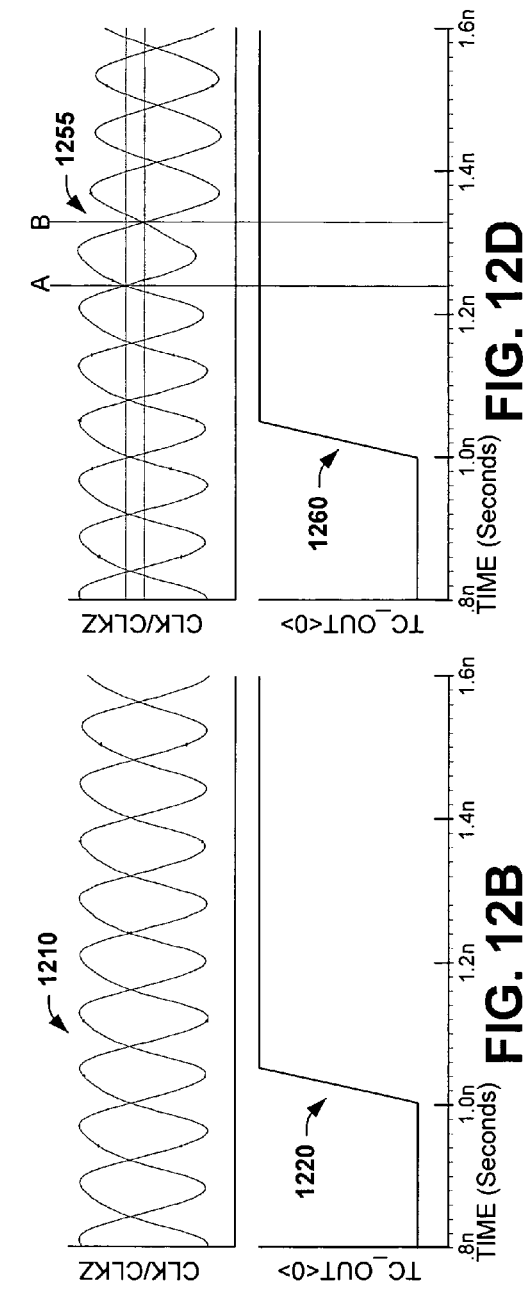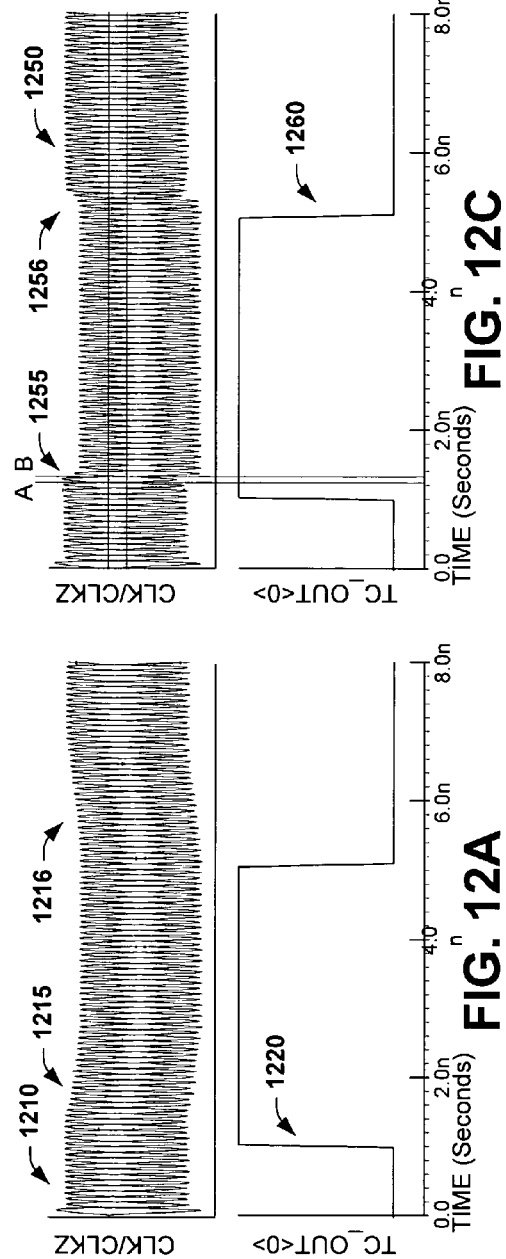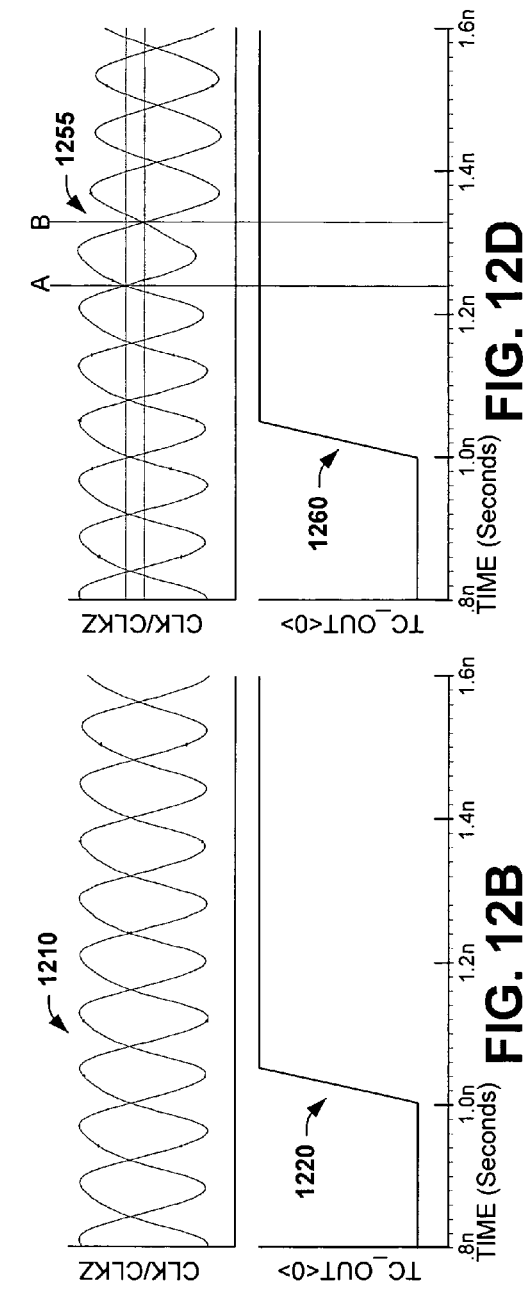

INTERPOLATOR BASED CLOCK AND DATA RECOVERY (CDR) CIRCUIT WITH DIGITALLY PROGRAMMABLE BW AND TRACKING CAPABILITY

FIELD OF THE INVENTION

The present invention relates generally to high speed encoded data communications, and more particularly, to systems and methods that recover clock information from encoded serial data with digitally programmable bandwidth logic to provide fast locking capability or improved tracking accuracy.

BACKGROUND OF THE INVENTION

There are several common serial communication standards currently available, including USB (Universal Serial Bus) 1.1 that provides communication speeds up to 12 Mbps (Million bits per second), FireWire (IEEE 1394) that operates at 400 Mbps, and USB 2.0 that operates at a maximum of about 480 Mbps. The operational speeds of these standards have increased over time. For example, the speed of USB 2.0 versus USB 1.1 illustrates an improvement of over 40 times. State of the art optical networks used in data communications and telecommunications operates at bit rates up to 40 Gbps (billion bits per second).

Generally, serial communication includes a transmitter and a receiver. The transmitter encodes or modulates a lower speed parallel data bus into a higher speed serial data stream that is then placed on a communication media. The serial data stream travels on the communication media and is then obtained from the media by the receiver. The serial data stream is then processed by the receiver in order to decode or recover the original data and de-serialize the resulting data into a duplicate parallel data bus.

Several techniques exist to encode the serial data and many signaling approaches can be used to transmit the data. Encoding techniques are used to embed a guaranteed density of transitions in the data and to facilitate reconstruction of the parallel data bus at the receiver. An example of these encoding techniques is 8b-10b encoding used on the physical layer in Gigabit Ethernet, PCI-Express, Fibre Channel, and 1394. Another encoding method is referred to as scrambling, which is used in SONET (Synchronous Optical NETwork). At the lowest level, the signaling approach can be as simple as NRZ (non-return to zero) binary, where 0 bit is encoding as one voltage level and a 1 bit is encoding at a different voltage level as illustrated in FIG. 1, and designated at reference numeral 100. Another commonly employed serial encoding/decoding scheme is (Non-Return-to-Zero Inverted) encoded and bit stuffed.

NRZI is a data transmission method in which the polarity of the bit is reversed whenever a 0 bit is encountered, and a static voltage level is transmitted whenever a 1 bit is encountered as illustrated in FIG. 1, and designated at reference numeral 110. NRZI thus uses the presence or absence of a transition to signify a bit (indicating a logical 0 by inverting the state). Combined with bit-stuffing, where an extra 0 bit is inserted after every six consecutive 1 bits, this data encoding causes a guaranteed transition every 7 bit times when a data payload would be all 1 bits. Every transition gives the CDR circuit phase information that it uses to align its recovered clock to the phase of the incoming data. The greater the frequency of transitions, the less phase error accumulates between the recovered clocks and the incoming data which is to be expected caused by frequency offset between the clock used to transmit the data and the recovered clock. Finally, the data can be transmitted using a multi-level signaling approach where multiple bits are encoded as multiple data levels and transmitted at a lower data rate. For example, if two bits are to be transmitted simultaneously at one half the equivalent data rate as the binary approach, four voltage levels can be assigned to the various bit combinations 00, 01, 10, and 11.

The structure of the data stream follows a specific communications protocol, which defines the rules for sending a block of data (each known as a Protocol Data Unit (PDU)) (e.g., 150 of FIG. 2) from one node in a network to another node. The exchanged PDUs comprises three parts: a sync sequence 160, a packet payload (also known as a Service Data Unit (SDU)) 170, and an End of Packet (EOP) 180. The protocol does not define or constrain the data carried in the payload portion 170 of the data block. The protocol does, however, specify the format of the sync sequence.

The incoming data stream may be at a different frequency or may exhibit wander from the receiving system. Each side of a communications link uses a reference clock that can vary from an ideal frequency within a +/− delta range as limited by a ppm tolerance value defined in a respective industry standard. Often, the source and receive frequencies are different. Regardless of the relative source and destination frequencies, the incoming data stream also exhibits all jitter components of an electrical transmission over a bandwidth limited media (e.g., data dependent cycle to cycle jitter).

Several types of clock recovery circuits exist. These include linear (also known as conventional) and phase interpolator based binary clock and data recovery. Any clock and data recovery (CDR) circuit attempts to recover the original transmitting clock despite these variations in reference frequencies or signal degradation due to jitter. A conventional CDR circuit attempts to recover the clock and data by utilizing a phase detector (PD) or alternatively a phase-frequency detector (PFD) to drive a charge pump followed by a loop filter and a voltage controlled oscillator (VCO) in a phase locked loop (PLL). The phase detector detects the absolute timing error between the current recovered clock and the timing of the ideal clock and together with the charge pump, generates an error signal proportional to the size of the timing error. This error signal is filtered using a loop filter and used to drive the VCO. These conventional linear techniques use an analog PLL, which due to variations in the transition density in the incoming data and variations in the manufacturing process, has a bandwidth, tracking capability, and frequency acquisition range that is not tightly controlled.

A phase interpolator based clock recovery system recovers the clock by examining the sign of the phase error between the current recovered clock and the data. If the recovered clock is too early, the clock recovery system delays the clock. If the recovered clock is too late, the clock is advanced.

In a conventional CDR, the capture range of the PLL and/or VCO used is typically narrow, and has a disadvantage of limiting the tracking capability (or bandwidth) of the CDR circuit, particularly when a wide range of data rates is anticipated. The analog types require many special analog components which can be difficult to implement in integrated circuit devices, and when not carefully designed may not function properly under all conditions.

As in any CDR circuit, an interpolator based CDR attempts to position the recovered clock at the center of each bit time of an incoming data stream. By sampling each bit at the center and transition point (i.e. ½ of a bit time from the center) and examining the signs of the center and transition samples, it is possible to derive whether the recovered clock is early or late with respect to the serial data stream. When a decision of early/late is made, the interpolator then makes a discrete step to either advance or retard the phase of the output clocks in an attempt to properly align the clock and data. Contrary to a conventional CDR circuit, where the size of the phase update is related to the magnitude of the phase error, the phase update from an interpolator CDR is typically the same regardless of the phase error magnitude. This can be detrimental to the integrity of the recovered clocks if the early/late decision is actually incorrect due to jitter in the incoming data or the recovered clock. In order to minimize the possibility of making an incorrect phase update, an interpolator based CDR will typically collect transition and center samples from multiple bit periods, calculate whether each clock edge was early or late, then calculate whether on average the clocks were early or late prior to making any updates in the phase of the recovered clock.

Because of the time consumed to actually collect these samples, the large amount of processing required to identify early/late for each bit and whether the total of clocks were early or late, and the latencies of the various circuits of the system, the update rate and therefore the bandwidth of the CDR is limited. In addition, different industry standards and different applications require different amounts of clock recovery bandwidth or tracking capability. Accordingly, it would be desirable to have systems and/or methods that monitor and correct recovered clock(s) in order to facilitate improved clock and data recovery of incoming or received serial data streams while providing programmable bandwidth and tracking accuracy.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates operation of clock and data recovery systems by providing systems and methods of maintaining a fixed tracking capability of an interpolator based clock and data recovery (CDR) circuit at multiple data rates. The present invention provides a wide data rate range CDR circuit using a phase interpolator optimized for a fixed frequency. In addition, the invention facilitates digitally programming the update rate and interpolator step size of the CDR circuit to provide an increased bandwidth for fast locking CDR operations, and/or a reduced bandwidth for improved tracking accuracy for use in synchronous systems. This allows the CDR circuit to be tailored to a wide variety of end-user applications.

The CDR of the present invention comprises a phase interpolator that can generate an output clock(s) with N discrete phases, a divide-by-M programmable divider having rate control logic, input data sampler(s), early/late voting (ELV) logic, and a finite state machine (FSM) also incorporating rate control logic.

The interpolator of the present invention, comprising in one example a mixer and a digital to analog converter (DAC), runs at a fixed frequency and utilizes post dividers to provide the ability to operate, for example, at multiple data rates over a wide range of data rates. For example, the mixer can generate an output clock whose phase is related to the phase difference between the input clocks and the weight of the DAC codes. The interpolator of the present accepts multiple phases of an input clock operating at a fixed input clock period ($T_{CLK}$) and generates one of N output phases at the same frequency of the input clocks. For example, the input clocks could be provided by a voltage controlled oscillator (VCO) operating at a rate of, for example, 6.25 GHz or 12.5 GHz, and providing, for example, four clock phases each equally separated by about 90 degrees.

The dividers of the present invention may comprise multiple individual dividers, or collectively may be represented as a single divide-by-M programmable divider. The programmable divider provides clocks used for lower data rates (e.g., full, ½, ¼, ⅕, ⅛, or other such 1/M rates) from a higher speed clock output (for example 6.25 GHz) from the phase interpolator for support of systems operating at, for example, 12.5 Gbps, 6.25 Gbps, 3.125 Gbps, 1.5625 Gbps and 1.25 Gbps. The divider ratio may be, for example, manually selected by initial presets at the divider(s), or automatically selected by a frequency/rate detector slaved to the recovered clock or data rate. However the divider is selected or enabled, the divider of the present invention is essentially set to generate the proper frequency clocks related to the rate of the serial data, yielding a "rate programmable divider".

The finite state machine (FSM) of the present invention determines which two adjacent phases of the VCO clock are selected for the DAC logic of the interpolator and the relative weightings of the two phases used in the mixer. These weightings are often the DAC codes used to drive the phase interpolator. The FSM is also logically controlled by the input data rate. The finite state machine also controls how often the phase of the output clock from the phase interpolator is updated (often called the update frequency or loop latency). The FSM of the present invention also controls the magnitude of the phase steps taken by the phase interpolator by controlling the phase selection and DAC codes such that a single update results in single or multiple steps in the output clock phase from the phase interpolator. The finite state machine may further comprise an anti-glitch circuit to prevent glitches (defined as short or missing clock pulses) at the output of the interpolator when a large number of simultaneous phase correction steps are taken. This circuitry, in one aspect of the present invention spreads out (distributes) a single large step phase correction into multiple smaller (partial) phase correction steps evenly distributed over the total time of the large phase correction step required. In this way, a large phase correction is permissible within a single interpolator update period without requiring the design of a phase interpolator capable of accurately making both large and small phase updates, which are often contrary design requirements. This prevents the interpolator from taking a large instantaneous step in its output phase, which may otherwise produce a short or missing clock pulse at the output of the phase interpolator or subsequent circuits.

The magnitude of the phase correction required, and therefore the number of the partial steps, in accordance with the present invention, is determined by the incoming data rate or by the end user requirements appropriate to the system, such as a high bandwidth required in systems where the tolerances between the transmit and receive reference clocks is low or a low bandwidth appropriate in fully synchronous data systems. In one aspect of the present invention, the anti-glitch circuit may comprise a thermometer coded DAC code where a plurality of delay circuits (e.g., 4, 8, or 16 circuits) is used to sub-divide a large phase step change into a plurality of partial step sizes, for example, 1, 2, 4, or 8 small phase correction steps.

The CDR of the present invention maintains a constant bandwidth at multiple data rates by allowing the phase interpolator to take multiple steps at each update for lower data rates, provided by the programming of multiple steps per update for support of the systems operating at, for example, 12.5 Gbps, 6.25 Gbps, 3.125 Gbps, 1.5625 Gbps and 1.25 Gbps. Since the phase step size is fixed with respect to the interpolator clock, as the data rate decreases, the tracking capability also decreases. For example, with a phase interpolator with 128 steps operating at 6.25 GHz ($T_{CLK}$=160 ps) used in a 6.25 Gbps system, each step corresponds to 160/128=1.25 ps. Each step corresponds to $1/128^{th}$ of a 6.25 Gbps unit interval (UI). When used in a 3.125 Gbps system, each step now equals only $1/256^{th}$ of a 3.125 Gbps UI. If the update rate or step size is not adjusted, the bandwidth would be halved for the 3.125 Gbps with respect to the 6.25 Gbps system. The CDR of the present invention provides a substantially constant tracking ability over the range of data rates by keeping the number of steps referenced to the operating UI constant.

The present invention further maintains a constant bandwidth (BW) by programming the latency of the CDR to force the interpolator to update more or less frequently, as determined by the clock or data rate input, which may be supplied by the customer.

Further, the present invention provides a means to either increase the bandwidth of the CDR by increasing the number of steps per update and reducing the latency to allow for either tracking a rapidly changing input phase or to provide a fast locking CDR capability. Alternately, the invention provides a means to decrease the BW of the CDR by decreasing the number of steps per update and increasing the latency to provide for higher accuracy transition placement in slowly changing or synchronous systems.

The present invention obtains the current data rate input, sets the rate programmable divider ratio based on the obtained data rate to adjust the clock frequency to approximately match that the rate of the input data stream. It also uses the data rate input to adjust the phase correction step size. The present invention uses the adjusted size phase step to keep the BW of the CDR circuit substantially constant. Using the ELV logic, the present invention identifies an early, late, or neither indication for the recovered clock for each bit time. The present invention further distributes the phase correction step over a plurality of partial steps based on the obtained rate, which, as a result, prevents clock glitches from occurring, as would normally be associated with large phase correction steps. Thus, tracking capability is maintained regardless of the data rate or different clock recovery bandwidth is provided to suit the particular system requirements.

The present invention employs a rate programmable divider that operates over a wide range of clock and data rates. The current data rates may be manually input via presets by the end user, or automatically determined and controlled on-the-fly, for example, by frequency detection circuitry.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 is a table contrasting a typical implementation to the implementation of the present invention, illustrating the ability of the present invention to hold substantially constant the tracking capability and bandwidth of a CDR.

FIGS. 12A and 12B are plots of the transient response of a CDR circuit when 8 steps are taken simultaneously using an exemplary implementation of the present invention.

FIGS. 12C and 12D are plots of the transient response of a CDR circuit when 8 steps are taken simultaneously without using an exemplary implementation of the present invention.

DETAILED DESCRIPTION OF THE INVENTION

The present invention will now be described with respect to the accompanying drawings in which like numbered elements represent like parts. The figures provided herewith and the accompanying descriptions of the figures are merely provided for illustrative purposes. One of ordinary skill in the art should realize, based on the instant description, other implementations and methods for fabricating the devices and structures illustrated in the figures and in the following description.

The present invention facilitates clock and data recovery for serial data streams by providing a mechanism that can be employed to maintain a fixed tracking capability of an interpolator based CDR circuit at multiple data rates. The present invention further provides a wide data rate range CDR circuit, yet uses an interpolator design optimized for a fixed frequency. The invention employs a rate programmable divider circuit that operates over a wide range of clock and data rates to provide various frequencies of output clocks to properly generate retimed data and recovered clocks from a clock generator such as a voltage controlled oscillator (VCO) operating at a fixed clock frequency. The divider and a finite state machine (FSM) of the exemplary CDR circuit are manually programmed based on the data rate. Alternately, the data rate may be detected from a recovered serial data stream during CDR operations (on-the-fly) utilizing a frequency detection circuit to automatically program the divider and FSM to provide CDR circuit operation at the nearest base clock rate.

Figure 1:
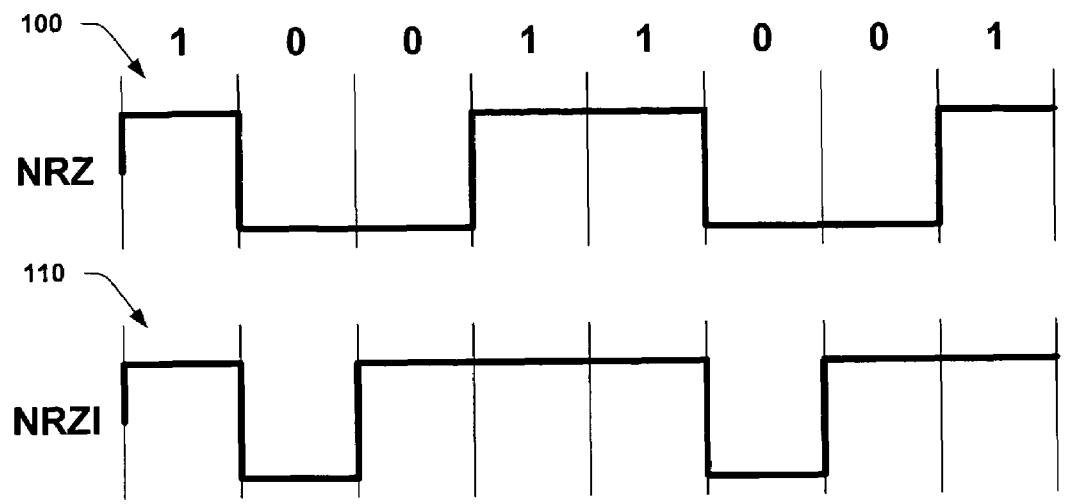
FIG. 1 is a diagram illustrating an example of NRZ and NRZI data encoding.
Figure 2:
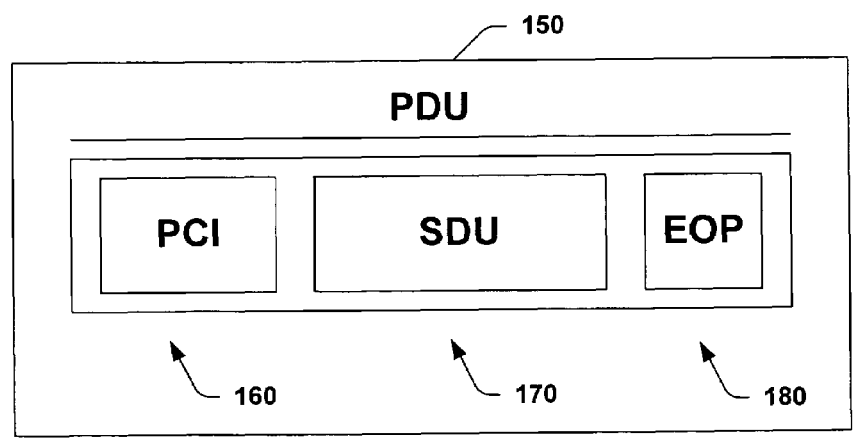
FIG. 2 is a diagram illustrating an exemplary structure of a data stream.
Figure 3A:
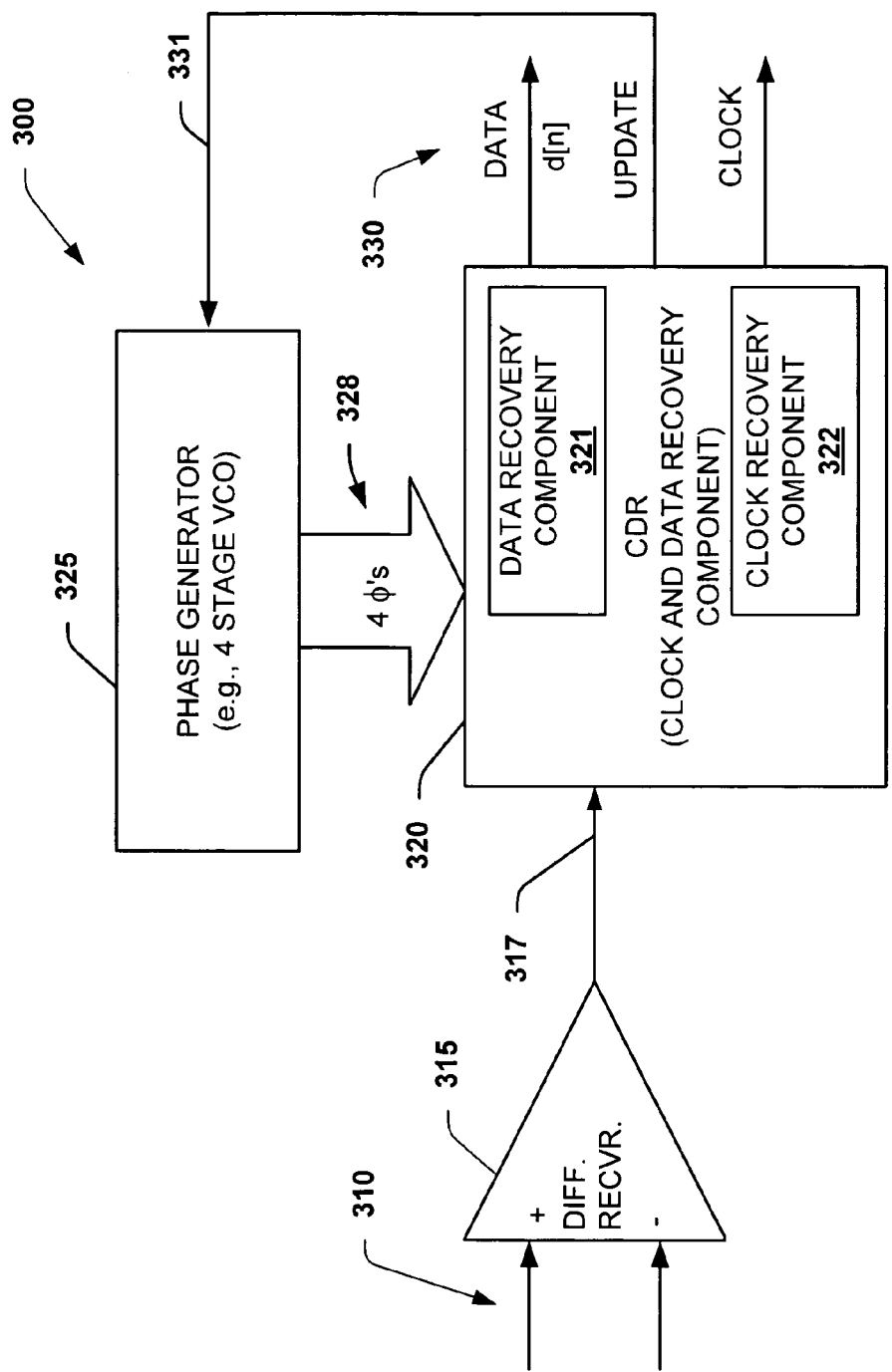
FIG. 3A is a diagram illustrating an exemplary clock and data recovery system in accordance with an aspect of the present invention.

FIG. 3A illustrates an exemplary CDR system 300, in which several aspects of the current invention may be accomplished. A received serial data stream 310 enters a receiver (e.g., or transceiver) 315 and outputs a buffered serial data stream 317 into a CDR circuit 320. Alternatively, the serial data stream can directly enter the CDR circuit 320. A phase generator 325 generates a local clock signal(s) running at approximately the same frequency as the transmitter clock utilized to initially generate the received serial data stream 310. The phase generator 325 produces multiple phases 328 (e.g., 4 or 8 phases) of the clock signal which are supplied to the CDR circuit 320.

The clock phases 328 of the example, together with the received data stream 317 are input to the CDR circuit 320, which is operable to obtain a recovered clock and recovered data 330. The recovered clock and data 330 can then be provided to an electronic or computer device for further processing.

A data recovery component 321 samples and detects data stream transition(s) of the received serial data stream 310 and obtains the recovered data therefrom. A clock recovery component 322 is operable to recover one or more clocks associated with the recovered data. Although the data recovery component 321 and the clock recovery component 322 are illustrated separately in FIG. 3A, these components can share common components and circuits, such as for maintaining a fixed tracking capability of an interpolator based CDR circuit at multiple data rates or maintaining a substantially constant circuit bandwidth. The clock recovery component 322 also generates update signals 331 to the phase generator based on the timing between the recovered data and recovered clock.

Figure 3B:
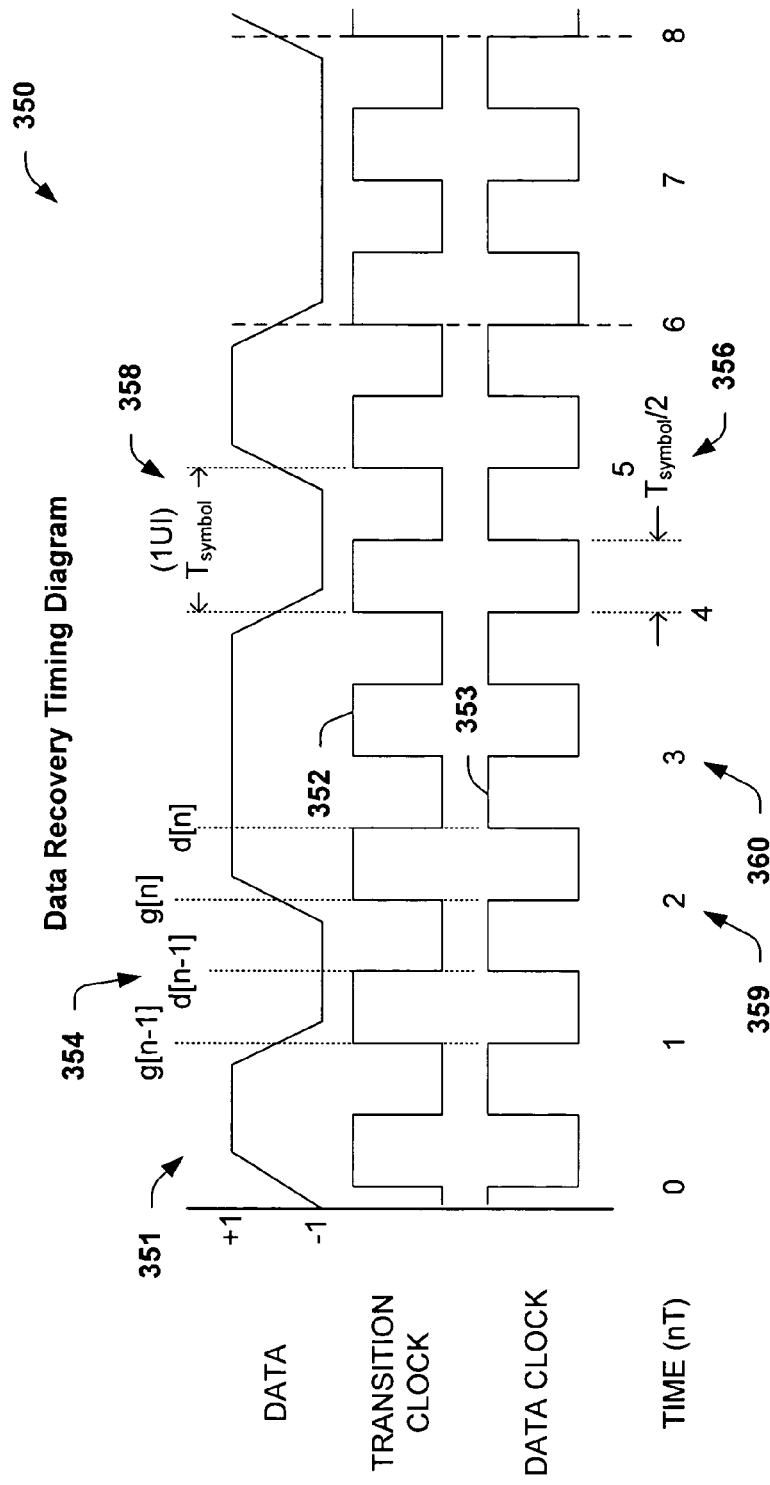
FIG. 3B is a timing diagram illustrating nominal ideal transition sampling points during operation of a clock and data recovery system in accordance with an aspect of the present invention.

FIG. 3B illustrates the data recovery timings 350 of the sampling points and other areas of interest in the clock and data stream used by the CDR circuit 320 in accordance with an aspect of the present invention. CDR circuit 320 in the present example nominally samples the data stream at the center and transitions of each bit in the serial data stream. Ideally, the center samples should be obtained at a center of each bit time d[n] (the ideal sample point) of an incoming data stream and transition samples g[n] and g[n−1] should be obtained at the midpoint of any transitions in the serial data stream. However, non-ideal operating conditions such as timing errors, slight variations in frequencies at sending and receiving ends, degradation of the received signal due to losses in transmission and additive noise, and the like can cause the data clock and the transition clock to be off such that the center samples are not obtained substantially at the center of each bit time and that the transition samples are not obtained substantially at the transitions of each bit time.

The inventors of the present invention appreciate that in a given bit time, the data and transition clocks can be considered early if a transition is detected between a current data/center sample d[n] and a current transition sample g[n], which is the transition sample taken immediately prior to the center sample. Similarly, the data and transition clocks can be considered late if a transition is detected between a current transition sample g[n] and a previous center sample d[n−1].

In the data recovery timing diagram 350 of FIG. 3B for example, a data clock is ideally used to obtain samples at the center of each bit and a transition clock is used to obtain samples at the transitions. The diagram covers consecutive bit times across an x-axis and depicts a data stream 351, a transition clock 352, a data clock 353, and data samples (center d[n] and transition g[n]). The transition clock 352 is present to obtain the transition samples g[n] and the data clock 353 is present to obtain the data or center samples d[n]. The transition samples g[n] are obtained on rising transitions of the transition clock 352 and the center samples d[n] are obtained on rising transitions of the data clock 353. In a CDR system used to recover the clock from a binary NRZ signal, the input data stream is sampled at the rising edge of the clocks 352, 353 and the data samples d[n] and transition samples g[n] are determined by the voltage at the input to the CDR circuit at the instant of the rising edge of the clocks 352, 353.

The inventors of the present invention further appreciate that a digital NRZ data signal may be tracked in a phase interpolator based CDR circuit employing a digital phase detector. The digital phase detector nominally samples the NRZ signal at the transition point (transition samples g[n] and g[n−1]) and a point $T_{SYMBOL}/2$ (356) (data center sample d[n]) following the transition point, where $T_{SYMBOL}$ corresponds to the symbol period of 1 unit interval (UI) 358. Thus, a transition sample designated g[n] at nT 359 (e.g., where n=2) has a corresponding data sample $T_{SYMBOL}/2$ later, designated d[n].

Figure 4:
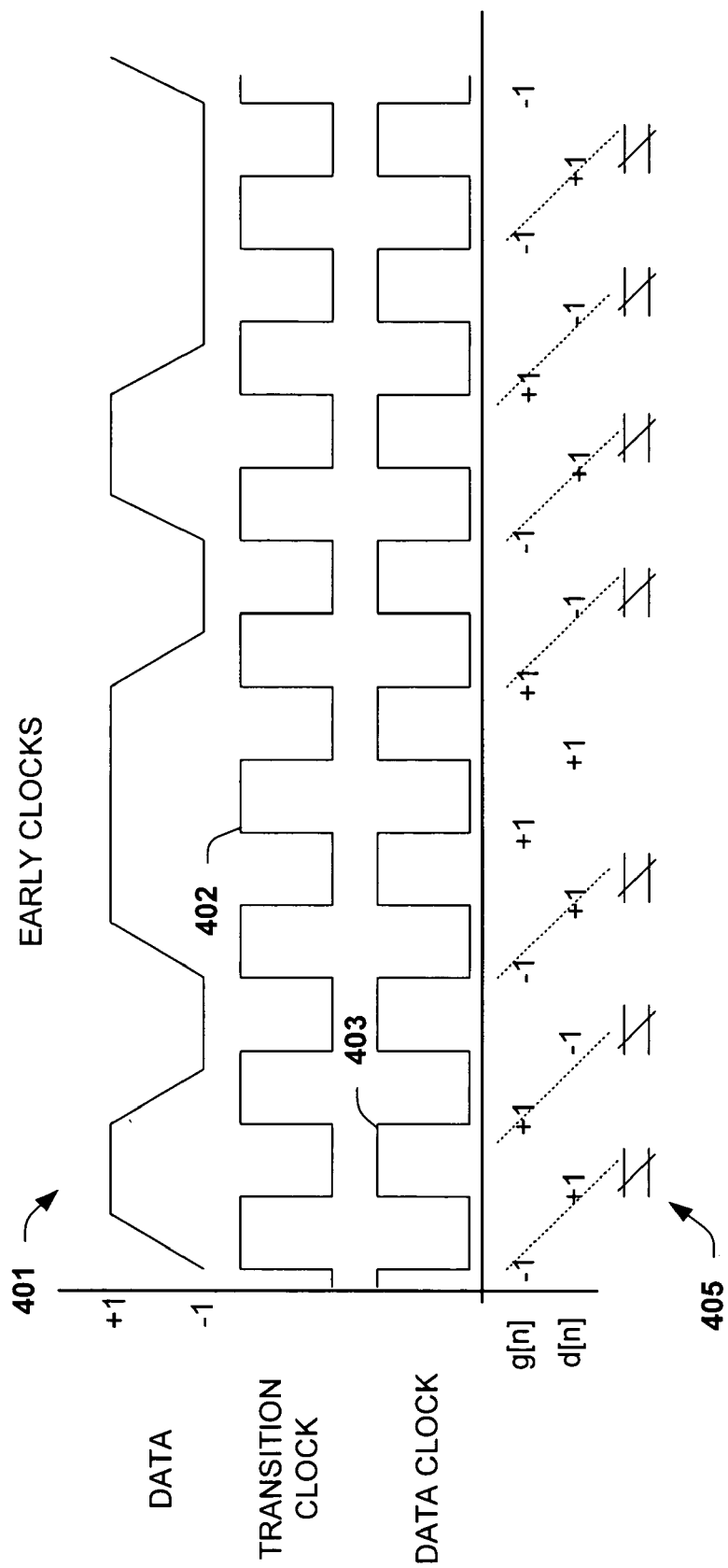
FIG. 4 is a timing diagram illustrating exemplary operation of a clock and data recovery component in accordance with an aspect of the present invention, wherein the clocks are early.
Figure 5:
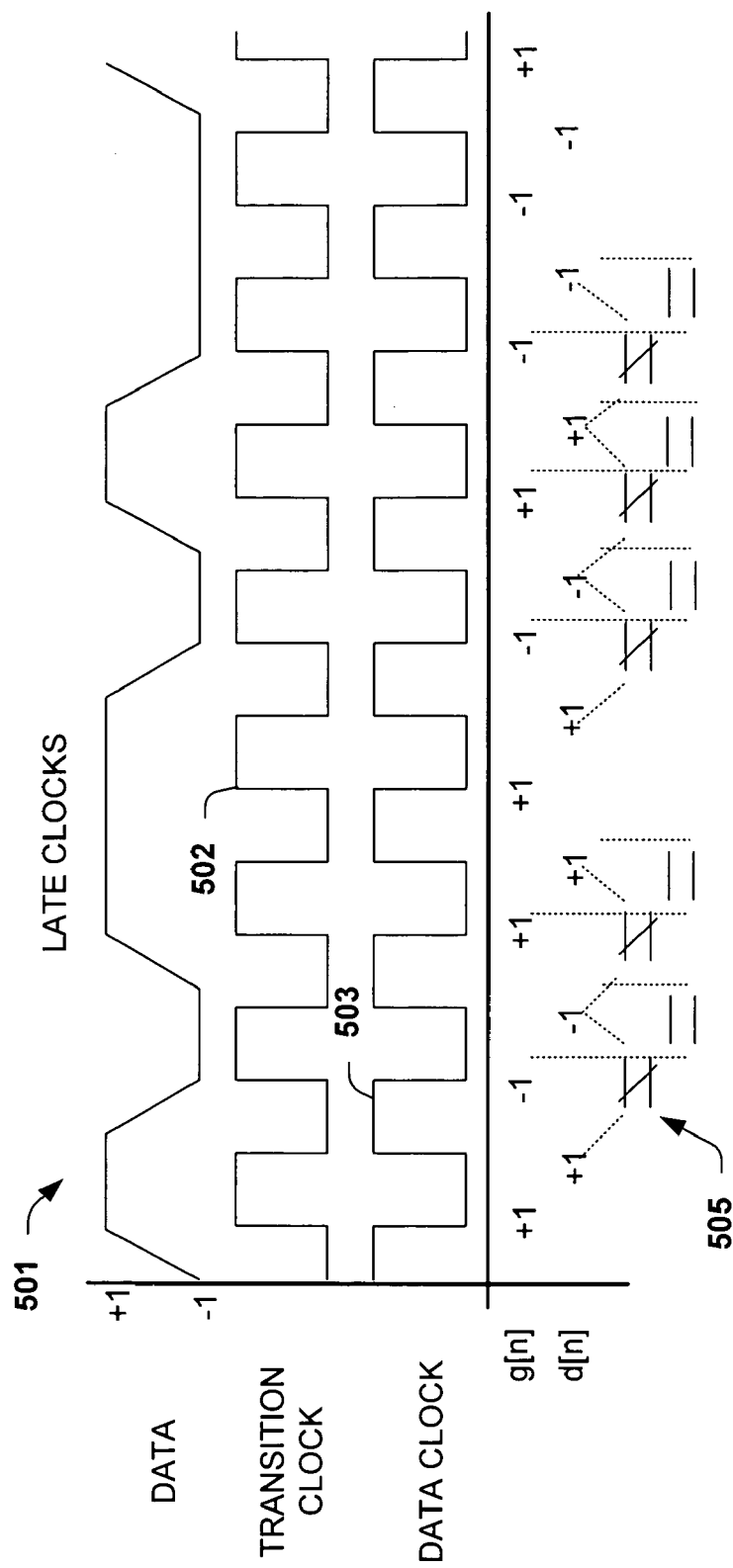
FIG. 5 is a timing diagram illustrating exemplary operation of a clock and data recovery component in accordance with an aspect of the present invention, wherein the clocks are late.

By comparing the values of d[n] and g[n], it is possible to determine whether the recovered clocks are early or late. These comparisons are illustrated in FIGS. 4 and 5 for an early clock and a late clock, respectively. For example, if d[n]≠g[n], then the clocks must be early, since the g[n] sample occurred before a transition. If d[n]≠d[n−1] and d[n]=g[n], then the clocks must be late since the transition sample g[n] occurred after the transition between data samples d[n−1] and d[n]. This data sampling information is often calculated for multiple samples of a serial data stream and input to an early-late voting engine. The present invention calculates how many samples were determined early and how many were determined late. A decision is then made as to whether the plurality of samples was early or late or whether there was a tie (an equal number of early and late votes). When the recovered clocks are properly centered, often referred to as being in lock, there will be an equal probability of early and late decisions for each bit, resulting in, on average, a tie in the total of early and late votes.

In response to the results of this vote, the clocks phases may be adjusted or corrected accordingly. This clock phase correction may be made after every bit time; however, in a typical phase interpolator based CDR, the phase correction is made less frequently since the discrete phase step size and the settling time of the clock recovery loop may result in erratic or unstable operating behavior or an undesirable overshoot in the recovered clock phase. Further, in a typical phase interpolator CDR, when the decision of early/late is made, the interpolator takes a single step to either advance or retard the phase of the output clocks in an attempt to properly align the clock and data. Because of the time it takes to actually collect several samples, the large amount of processing that needs to be done to determine whether the vote results were early or late, and the latencies of the various circuits in the system, there is a limit in how often the phase interpolator can be updated (update period). This is defined as the latency or the update rate of the phase interpolator loop.

As a result, the present invention is operable to utilize the data rate of the incoming data stream to program and adjust the number or size of the phase steps per update period, to effectively program the bandwidth and tracking capability of the CDR circuit. The clock recovery component 322 employs a digitally programmable divider circuit that employs one or more dividers programmed and enabled by the data rate to divide the interpolator output down for lower data rates and/or to provide additional phase correction steps per update period and for various data rates.

Further, another aspect of the present invention is operable to prevent interpolator update glitching (of the output clock signal) by providing a plurality of partial (smaller) clock phase corrections when multiple or large clock phase corrections are required during a single update period. Accordingly, the clock recovery component 322 employs a programmable delay circuit having a plurality of delay elements selected by a decode circuit tied to the data rate or desired step magnitude to spread out the overall larger phase correction into a series of sequential partial phase correction outputs. In this way, a smooth or gradual phase correction is provided by the phase interpolator within a single update period while preventing missing or distorted clocks signals and a better tracking capability.

Further details of such suitable circuits that may be employed with the clock recovery component 322 are provided infra.

FIG. 4 is a timing diagram illustrating exemplary operation of a clock and data recovery component in accordance with an aspect of the present invention, wherein the clocks are early. The diagram covers 8 consecutive bit times across an x-axis and depicts a data stream 401, a transition clock 402, a data clock 403, and data samples (center d[n] and transition g[n]). The transition clock 402 is present to obtain the transition samples g[n] and the data clock 403 is present to obtain the data or center samples d[n]. The transition samples g[n] are obtained on rising transitions of the transition clock 402 and the center samples d[n] are obtained on rising transitions of the data clock 403. As seen in the diagram, there are seven identified transitions in the 8 bit times. Because the clocks are early, transitions are detected between a current data sample d[n] and a current transition sample g[n] (the transition sample immediately prior to the current data sample), as indicated by 405. As a result, over these 8 bit times, a clock and data recovery component of the present invention would determine that the clocks are early and delay the clocks by a number of steps.

Turning now to FIG. 5, another timing diagram illustrating exemplary operation of a clock and data recovery component in accordance with an aspect of the present invention, wherein the clocks are late is provided. The diagram again covers 8 consecutive bit times across an x-axis and depicts a data stream 501, a transition clock 502, a data clock 503, and data samples (center d[n] and transition g[n]). The transition clock 502 is present to obtain the transition samples g[n] and the data clock 503 is present to obtain the data or center samples d[n]. Once again, the transition samples g[n] are obtained on rising transitions of the transition clock 502 and the center samples d[n] are obtained on rising transitions of the data clock 503. The data stream 501 is substantially identical to the data stream 401 of FIG. 4. However, the transition clock 502 and the data clock 503 are delayed or late with respect to the data stream 501. As a result, differences between transition samples and center samples are identified between the d[n−1] data samples and g[n] transition samples as indicated at 505 rather than a current data sample d[n] and transition sample g[n], as indicated in FIG. 4. In addition, a transition is detected since d[n−1] is different than d[n]. As a result, over these 8 bit times, a clock data recovery component of the present invention would determine that the clocks are late and speed up the clocks by a number of steps. As seen in FIGS. 4 and 5, the present invention can identify early and late clocks and can adjust or compensate the clocks to correct them.

Figure 6A:
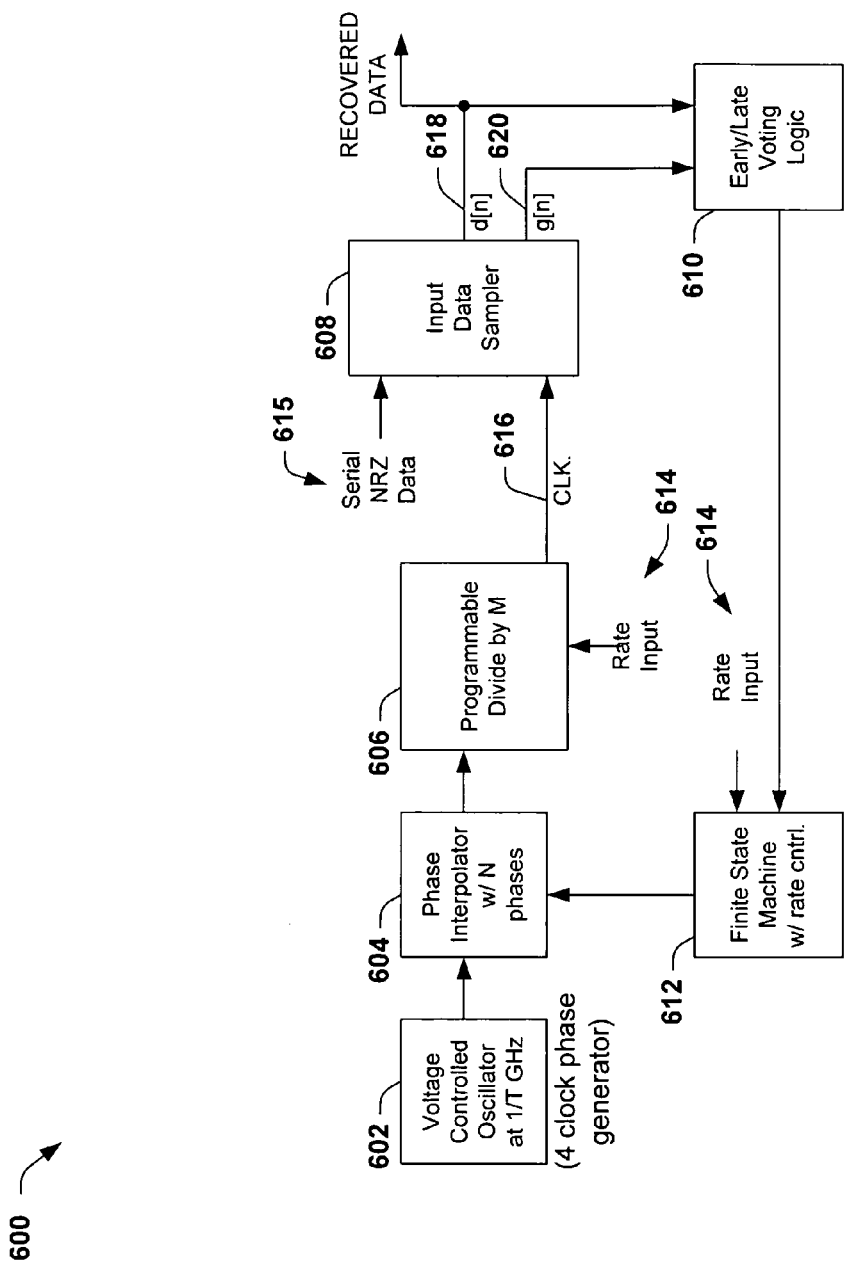
FIG. 6A is a schematic diagram of a CDR circuit having a digital rate programmable divider in accordance with an aspect of the present invention, wherein the data rate inputs are fixed and manually input.
Figure 6B:
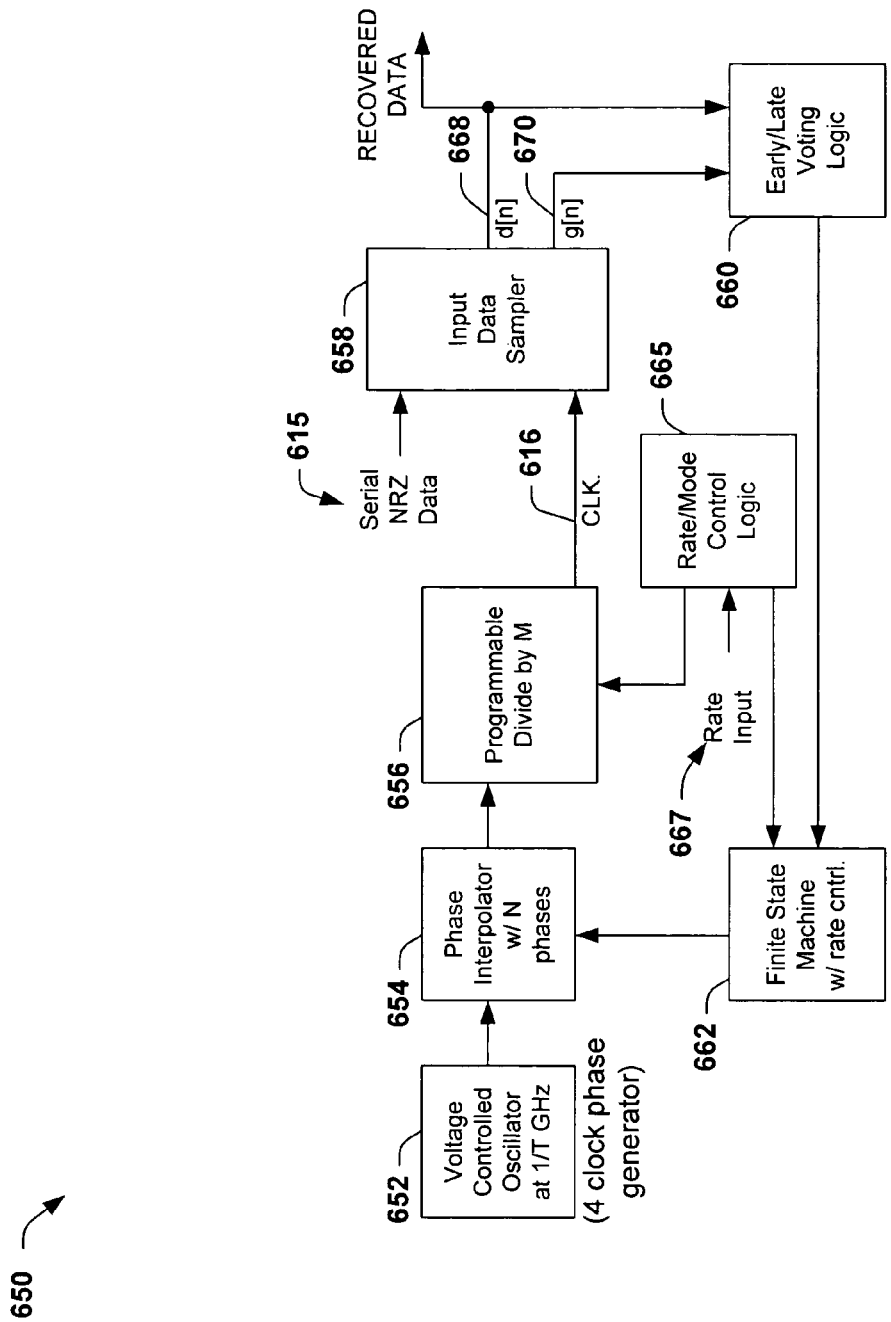
FIG. 6B is a schematic diagram of a CDR circuit having a digital rate programmable divider and rate/mode control logic in accordance with an aspect of the present invention, wherein the data rate inputs are fixed and manually input.
Figure 7:
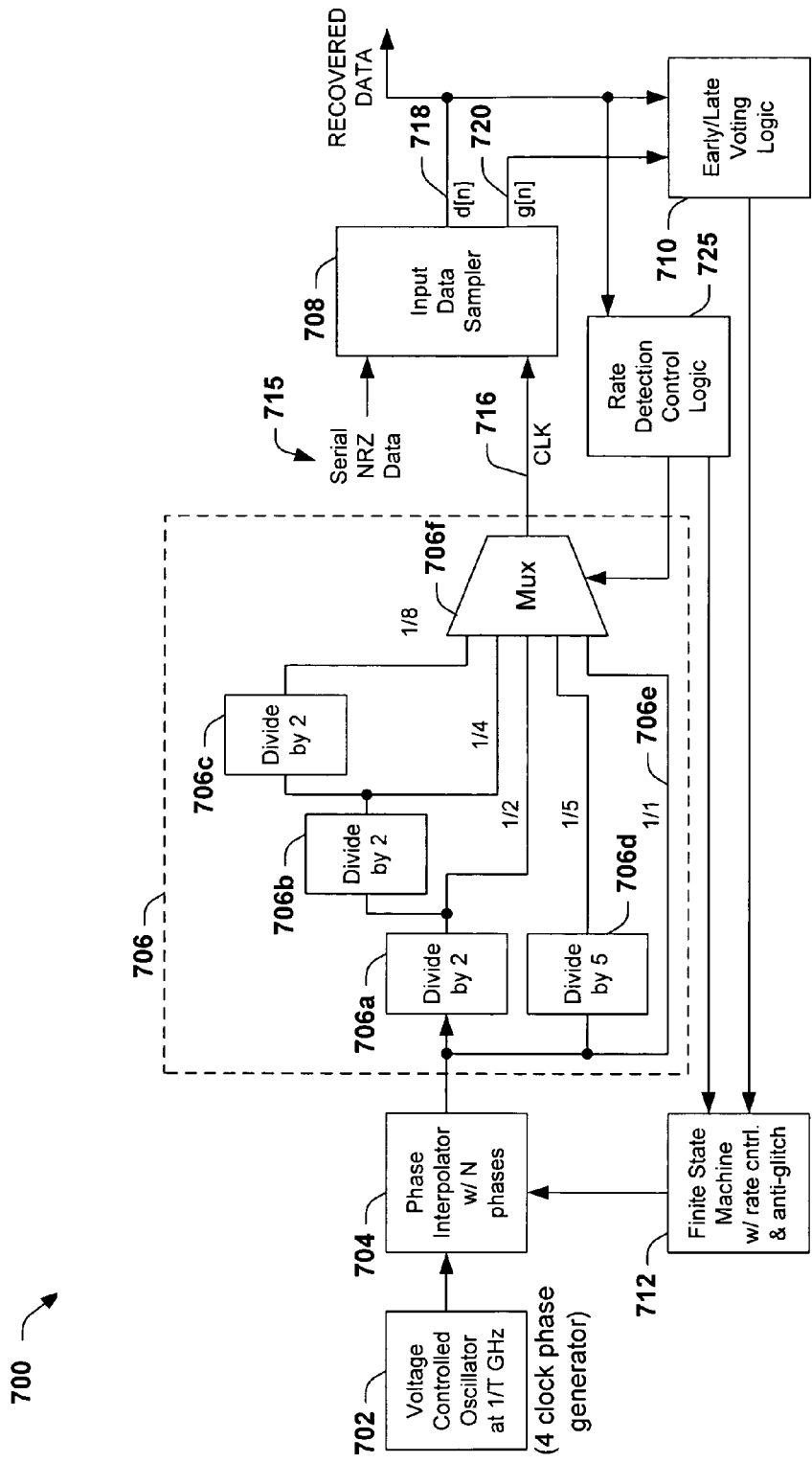
FIG. 7 is a schematic diagram of a CDR circuit having a digital rate programmable divider and rate detection control logic in accordance with an aspect of the present invention, wherein the data rate is automatically detected and used for mode control.

FIGS. 6A and 6B are schematic diagrams of a CDR circuit 600 and 650, respectively, having a rate programmable digital divider and finite state machine (FSM), wherein the data rate inputs are fixed and manually input in accordance with an aspect of the present invention. The CDR circuits 600 and 650 of FIGS. 6A and 6B are similar except that a rate/mode control logic is added to FIG. 6B to process the data rate into rate control signals for the programmable divider and the FSM, and as such the circuit of FIG. 6B will only be described further in terms of the added logic. In addition, FIG. 7 illustrates another similar CDR circuit 700 further illustrating an exemplary programmable divider implementation and an exemplary rate detector circuit to automatically extract a rate control signal from the recovered data rate without the use of a manual fixed rate input. The rate control signal in the schematic of CDR circuit 700 of FIG. 7, further illustrates an exemplary means of programming control for the dividers and the finite state machine.

Returning to FIG. 6A, an exemplary schematic diagram of CDR circuit 600 is illustrated in accordance with an aspect of the present invention. The circuit is a mixed signal and logic circuit using differential analog circuits and logic to process data samples to recover clock and data quickly and efficiently from an NRZ serial data stream. Circuit 600 is an interpolator based CDR circuit which includes a clock generation circuit such as a voltage controlled oscillator (VCO) 602, a phase interpolator 604 having the capability to output one of N output clock phases, a divide-by-M programmable divider 606, an input data sampler 608, an early/late voting logic ELV 610, and a finite state machine FSM 612.

The VCO 602 generates several (e.g., 4) equally spaced (e.g., 90 degree spaced) phases of a high speed clock. For example, in one implementation of the present invention, the VCO 602 generates four phases of a 6.25 GHz clock, each spaced 90 degrees.

The phase interpolator 604 is essentially a mixer and a digital to analog converter (DAC). The mixer takes the two of the phased clocks from the VCO 602 and generates an output clock whose phase is based on the phase relationship between the two phased clocks and the settings of the DAC. The FSM 612 selects two adjacent phases from the VCO 602 at any moment for the interpolator 604 and controls the relative phase contributions of the two adjacent phases to the phase of the output clock based on the DAC code outputs. For example, a 5 bit DAC may be used, with the phase of the output clock set by the phase separation of the clocks from the VCO 602 and the DAC setting. For the 6.25 GHz clock with 4 phases, each phase is separated by 90 degrees. The 5 bit DAC allows selecting any of 32 (N=32) discrete output clock phases within any quadrant. So, each LSB (least significant bit) of the DAC corresponds to:

1) degrees per step=degrees per quadrant/N phase steps per quadrant=90/32=2.8125 degrees of phase per step.

Thus, the phase interpolator is able to interpolate or subdivide between the two selected clock phases (selected by the FSM 612) to provide N=32 possible phase correction steps per quadrant, or 32 *4=128 phase correction steps over the full 4 clock phases (cycles).

The programmable divide-by-M divider 606 receives a rate input 614 having rate information of the data stream to control the divide ratio of the programmable divider. As will be discussed further and illustrated in FIG. 7, divider 606 of FIG. 6A may, for example, contain one or more individual dividers, which are programmed and selected by the rate input 614 using a multiplexor (mux). The divider 606 located after the interpolator 604 and before the input data sampler 608, allows the CDR circuit to operate over a wide range of data rates, as controlled by the rate input 614. Since the interpolator still operates at a fixed frequency, each divide-by two divider effectively halves the phase correction step size relative to the period of the divided-by-M output clock. For example, with the interpolator operating at 6.25 GHz and a divide by two clock desired, the 2.8125 degrees of a single step at 6.25 GHz corresponds to 1.25 ps of the 160 ps clock cycle. In the divide by two mode (divide ratio based on the data rate), this same LSB step is 1.25 ps of a 320 ps clock cycle, corresponding to a 1.406 degree step.

The early/late voting logic ELV 610 is described previously in association with FIGS. 3B, 4, and 5 and thus will not be discussed in detail here.

The finite state machine FSM 612 contains the logic that controls which two phases of the VCO clock are selected and the DAC logic. The rate input 614 based on the data stream data rate is further operable to control the bandwidth of the finite state machine FSM 612, by decoding and selecting the number (e.g., 1, 2, 4, 8) of steps per update period of the phase interpolator 604. In addition, the FSM 612 receives a signal from the early/late voting ELV block 610 to indicate whether to increment or decrement the phase of the interpolator. For example, if quadrature phases CLK0 and CLK90 are being interpolated, with CLK0 leading CLK90 by 90 degrees, at a given instant, the interpolator 606 may be required to output a phase halfway between these two selected phases. This output corresponds to a DAC code of 15 in this example, where the output phase is set by 16/32 of the phase of CLK0 plus the 16/32 of the phase of CLK90. If the ELV 610 indicates to the FSM 612 that the phase interpolator 606 needs to advance the output clock phase, the FSM 612 would switch the DAC code to 14, for example, directing the output phase of the interpolator to consist of 17/32 of the phase of CLK0 and 15/32 of the phase of CLK90. If the ELV 610 indicates to the FSM 612 to delay the phase, the FSM 612 would switch the DAC code would switch to 16, for example, directing the output phase of the interpolator to consist of 15/32 of the phase of CLK0 and 17/32 of the phase of CLK90.

The input sampler 608 samples the incoming serial NRZ data signal 615 ideally at the center and at the edge (transition) of every bit. The sampler 608 may contain several sampling circuits that may be thought of as simple "slicers", in that, if there is a logic 0 at the clock edge the sampler indicates a zero, and if there is a logic 1 at the clock edge, the sampler indicates a 1. A logic 0 is indicated by the signal being less than ½ of its average. A logic 1 is indicated by the input signal being greater than ½ of its average. Since the data is sampled at two points per bit, center d[n] and edge g[n], it is possible to detect transitions in the serial data and discriminate whether the recovered (interpolated) clock is early or late with respect to the serial data using the ELV logic 610 and as described earlier in association with FIGS. 3B, 4, and 5.

The recovered clock CLK 616 is available at the output of the programmable divider 606, and the recovered data 618, integral with the data samples (d[n]), at the output of the input data sampler 608 along with edge samples g[n] 620.

FIG. 6B is a schematic diagram of another exemplary CDR circuit 650 in accordance with an aspect of the present invention. As indicated previously, CDR circuits 600 and 650 of FIGS. 6A and 6B, respectively, are similar. For example, circuit 650 includes a clock generation circuit such as a voltage controlled oscillator VCO 652 similar to VCO 602, a phase interpolator 654 similar to 604 having N phase step capability, a divide-by-M programmable divider 656 similar to 606, an input data sampler 658 similar to 608, an early/late voting logic ELV circuit 660 similar to 610, and a finite state machine FSM 662 similar to 612. Circuit 650 of FIG. 6B further adds a rate/mode control logic circuit 665 to process the data rate 667 into rate control signals for the programmable divider 656 and the FSM 662. The rate/mode control logic 665 is operable to provide a conversion between a data rate indication or signal and a control signal(s) logically suitable for the programmable divider 656 and the FSM 662. For example, a 6.25 GHz rate indication input to the CDR circuit 650 may be converted to a set of logic levels and a mode selection for the programmable divider 656 and the FSM 662.

FIG. 7 is schematic diagram of yet another CDR circuit 700 in accordance with an aspect of the present invention. As indicated previously, CDR circuits 600 and 650 of FIGS. 6A and 6B, respectively, are similar to that of CDR circuit 700. For example, circuit 700 includes a voltage controlled oscillator VCO 702 similar to VCO 602, a phase interpolator 704 similar to 604 having N phase step capability, a divide-by-M programmable divider 706 similar to 606, an input data sampler 708 similar to 608, an early/late voting logic ELV 710 similar to 610, and a finite state machine FSM 712 similar to 612. Serial NRZ data 715 is again supplied to the input data sampler 708 of the CDR circuit to generate a recovered clock CLK 716, and a recovered data 718.

Circuit 700 of FIG. 7 also illustrates details of an exemplary programmable divider 706 and an exemplary detection and control logic 725 to automatically extract a rate control signal from the recovered data 718 along with the data samples d[n] and the transition samples g[n] 720. The rate detection and control logic 725 provides an exemplary means of programming control for the programmable divider 706 and the FSM 712.

The exemplary programmable divide by M divider 706 implementation illustrated in the CDR circuit 700 of FIG. 7 comprises several divide by two dividers 706a-706c serially wired along with a divide by 5 divider 706d and a thru-wired (or divide by one) signal 706e into a multiplexor 706f. The dividers of the exemplary programmable divider 706 permit, for example, a divide ratio of M=1, 2, 4, 5, or 8 for a corresponding range of data rates from a fixed VCO frequency. Any number of other divider combinations or permutations is anticipated in the programmable divider 706 to supply any number of clock 716 and data rates from a given fixed VCO frequency.

Some of the parameters of a phase interpolator based CDR circuit similar to those which have been shown thus far, may be summarized as follows:

$T_{SYMBOL}$=symbol period or 1 UI (Unit Interval)=1 bit period $T_{CLK}$=sampling clock period N=number of time positions available to a phase interpolator Tupdate=$T_{CLK}$/N=step size of interpolator Lat=latency of updates in multiples of $T_{SYMBOL}$ One way to express the bandwidth of the CDR is by the tracking capability of the CDR circuit loop. This is the maximum amount of steady state frequency offset that can be tolerated between $T_{SYMBOL}$ and $T_{CLK}$ and is usually expressed in parts per million (ppm). This bandwidth (BW) can be calculated by $10^6$/(N*Lat). Increasing either Lat, the number of symbols required between phase interpolator updates or N, the number of possible phase positions of the interpolator, decreases the possible bandwidth.

Thus, the CDR circuits illustrated in the present invention are operable to utilize the data stream data rate to program and adjust the number of steps per update period (phase correction steps within an interpolator update period), to effectively program the bandwidth or tracking capability of the CDR circuit.

In addition, the rate programmable divider and FSM of the present invention permit the phase interpolator to operate at a fixed input clock frequency with a fixed number of steps. Integrating post dividers after the phase interpolator provides clocks that may be used for lower data rates (e.g., for full, ½, ¼, ⅕, and ⅛ rates) as shown in FIG. 7.

FIG. 8 illustrates a table 800 contrasting a typical implementation to an exemplary implementation of the present invention, demonstrating the ability of the present invention to hold substantially constant the bandwidth (tracking capability) of a CDR circuit (e.g., FIGS. 6 and 7). The present invention maintains the CDR bandwidth constant at multiple data rates by allowing the phase interpolator to take multiple steps at each update for lower data rates. Table 800, for example, illustrates the programming of multiple steps/update for a 12.5 Gbps system with support for 12.5 Gbps, 6.25 Gbps, 3.125 Gbps, 1.5625 Gbps and 1.25 Gbps. In this example, the VCO clock frequency is fixed at 6.25 GHz, N is fixed at 64 steps, and multiple phases from the VCO are used to sample g[n] and d[n]. Since the step size is fixed with respect to the 6.25 GHz interpolator clock, as the data rate decreases, the tracking capability likewise decreases. The tracking ability measured in ppm is, 2) tracking ability (ppm)=$10^6$/(Lat*(Steps/UI)/(Steps/Update), and as shown, is approximately constant over multiple data rates.

Another aspect of the present invention allows programming the latency (the update rate of the phase interpolator loop) to force the interpolator to update more or less frequently, as determined by the clock or data rate input. This is also shown in table 800 of FIG. 8 as a means to keep the bandwidth constant. As discussed, the data rate may be manually programmed into the CDR circuit by the customer, or automatically detected and applied to the programmable divider and FSM circuits (e.g., 706 and 712).

Taking multiple steps per update and allowing the interpolator to update more or less frequently provides a means in the present invention to either increase or decrease the BW of the CDR circuit. The BW is increased by programming a larger number of steps per update and reducing the latency to allow for either tracking rapidly changing input phases or to provide a fast locking capability. The BW is decreased by decreasing the number of steps per update and increasing the latency to provide for higher accuracy edge placement in slowly changing or synchronous systems.

The primary advantage of dividing after the phase interpolator versus before the phase interpolator is the ability to operate the phase interpolator at a fixed clock frequency. Phase interpolators must be carefully designed in terms of their output bandwidth. This bandwidth is separate and distinct from the bandwidth of the CDR circuit. This refers to the analog bandwidth of the mixer circuit used in the phase interpolator. If this bandwidth is too high, the interpolation tends to suffer from distinct steps in the output waveform caused by the switching behavior of the mixer circuit and input clocks not being properly filtered. This results in either an increase in the recovered clock jitter or non-uniformity of the individual phase steps. If the mixer bandwidth is too low, the output clock swing will be reduced and additional gain will be required in subsequent stages to compensate for the reduced output swing of the interpolator.

Although another implementation of operating a CDR from a fixed frequency from a clock generation circuit such as a voltage controlled oscillator and a phase interpolator optimized for the same fixed frequency may attempt to operate over multiple data rates by keeping a constant output clock rate and discarding d[n] and g[n] samples, the disadvantage to data processing using a high speed clock and discarding samples is some extra complexity in the CDR circuit. This may be minimal for certain designs but can make system design overly complex for systems such as decision feedback equalizers, which require proper sequencing and discrimination of data and transition samples. These attempts may also require continuous buffering and distributing of the high speed clocks, regardless of data rate, thereby consuming higher power.

Figure 9A:
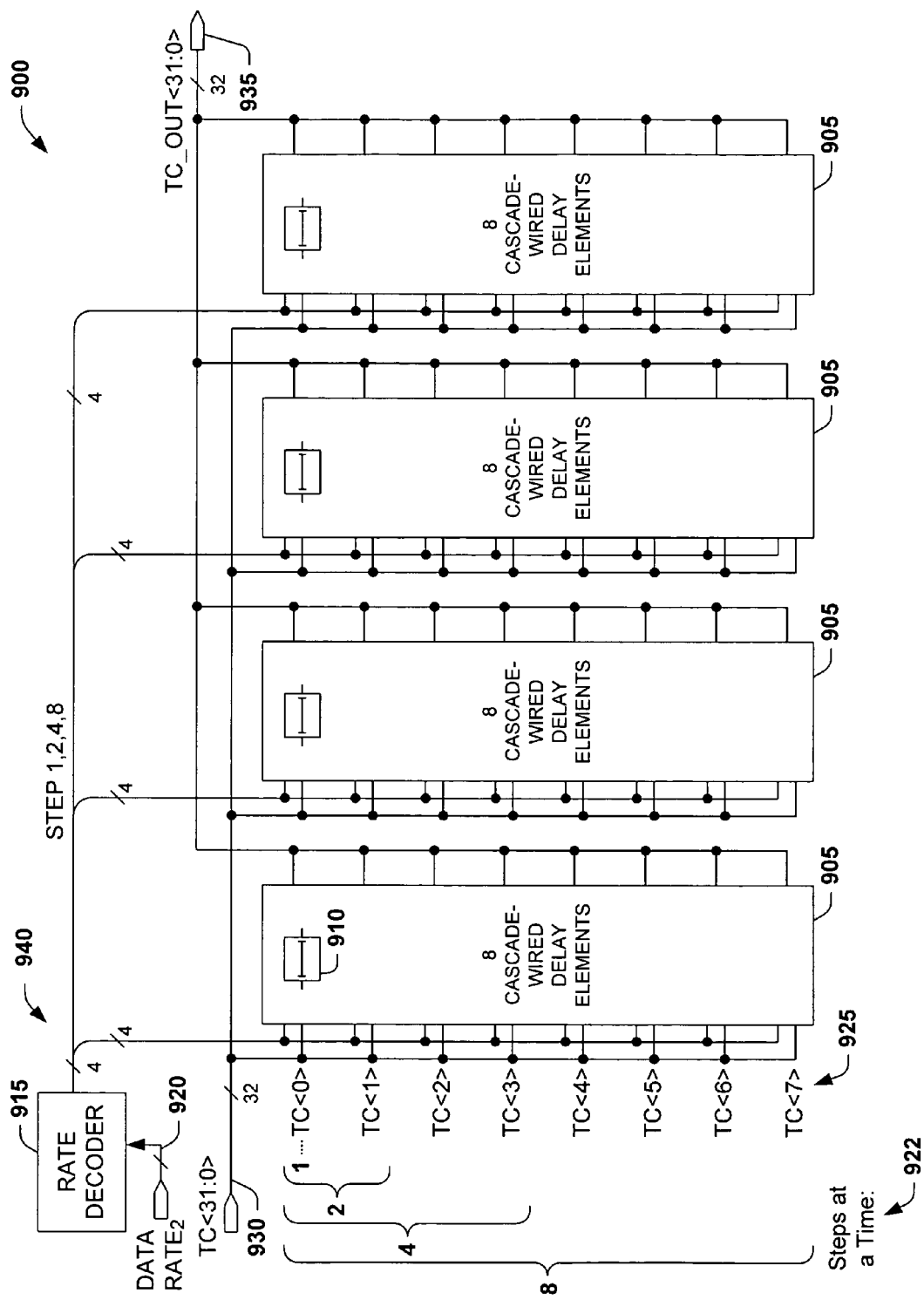
FIG. 9A is a schematic diagram illustrating an exemplary anti-glitch circuit for preventing clock glitching during an interpolator update in accordance with an aspect of the present invention.
Figure 9B:
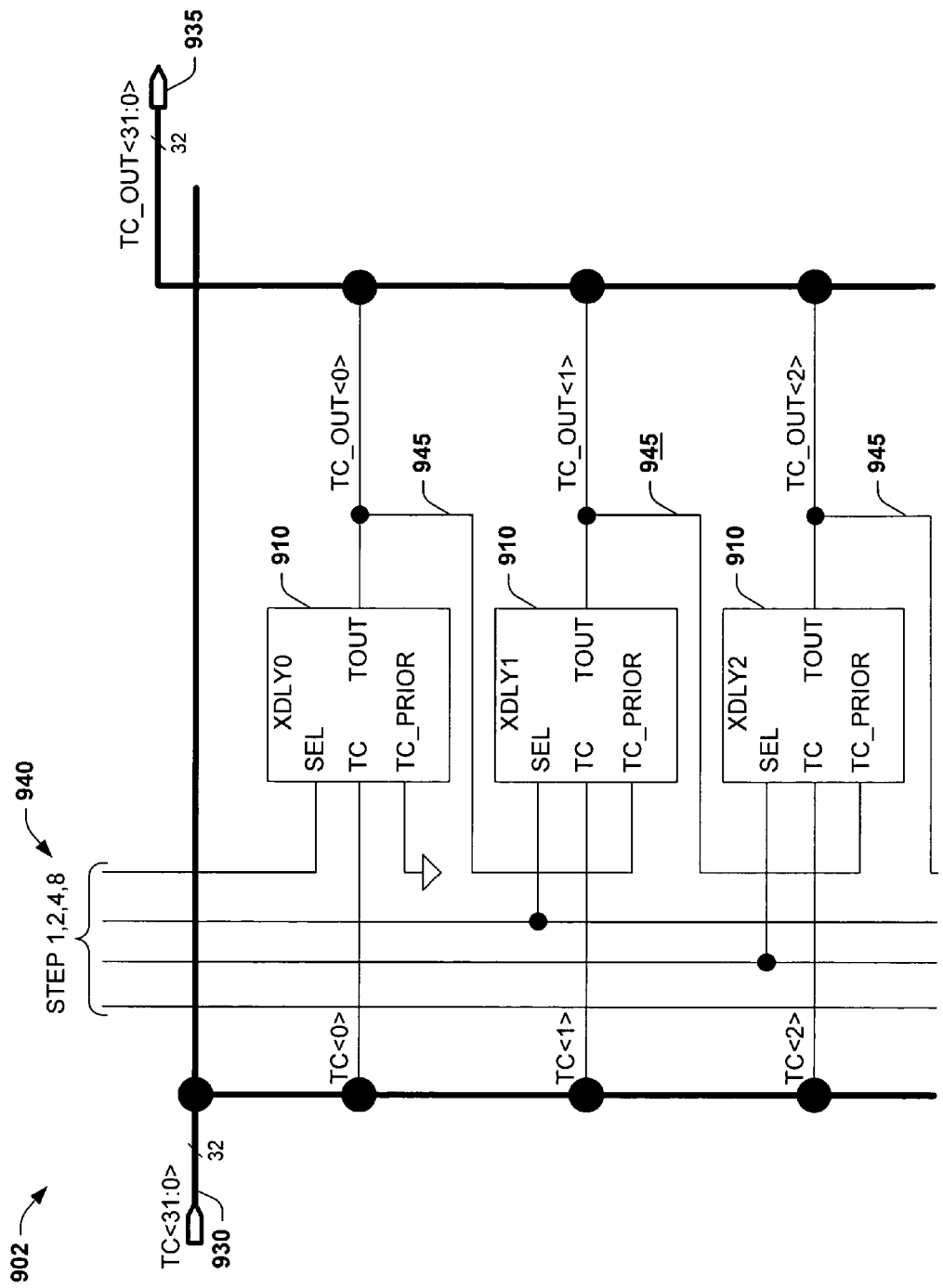
FIG. 9B is a detailed schematic diagram illustrating an exemplary cascade wiring scheme of several delay elements used in the anti-glitch circuit of FIG. 9A.
Figure 10:
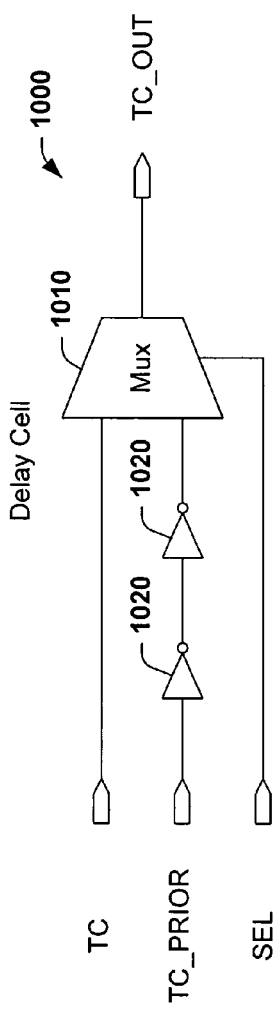
FIG. 10 is a schematic diagram illustrating an exemplary delay element used in the anti-glitch circuits of FIGS. 9A and 9B.

Another aspect of the present invention provides a means to prevent glitches (defined as short or missing clock pulses) at the output of the interpolator when a large number of simultaneous steps are taken. This is performed by delaying the toggling of signals either on or off as multiple steps are taken to spread out a single large step into multiple smaller steps. FIGS. 9A, 9B and 10 illustrate one possible approach to achieve this.

FIGS. 9A and 9B illustrate schematic diagrams of an exemplary anti-glitch circuit 900 for preventing interpolator update glitching during an interpolator update in accordance with an aspect of the present invention. FIG. 9B is an exemplary circuit portion 902, illustrating further circuit details and an exemplary cascade wiring scheme of several delay elements used in the anti-glitch circuit 900 of FIG. 9A. FIG. 10 also illustrates details of an exemplary delay cell 1000 used in the anti-glitch circuit 900 of FIG. 9A and the circuit portion 902 of FIG. 9B.

When large phase correction steps or a large number of phase correction steps are requested of the phase interpolator (e.g., 604, 654, 704) during a single update period by the voting logic (e.g., 710) and the FSM (e.g., 712), a distortion of the clock signal may result at the output of the interpolator or in the extreme case, even a missing clock pulse. In this situation, the mixing portion of the phase interpolator may not respond correctly to the input clock signals (e.g., from the VCO 702) and the digital control signals (e.g., from the FSM 712). In this case, a single large step can create an output clock pulse that is too long or too short relative to the desired step size. Too short a pulse requires a higher bandwidth from the mixer in the interpolator and subsequent stages to avoid further shorting of the pulse, or, in the extreme case, a dropped clock pulse. In other words, the control circuits demand higher BW from the circuits and signals involved. This demand of higher BW can result in greater power consumption or improper operation of the mixer relative to its ideal BW, as discussed previously.

The anti-glitch circuit 900 of FIGS. 9A and 9B prevent interpolator update glitching of the clock signal by providing a plurality of partial (smaller) clock phase corrections when multiple or large clock phase corrections are required during a single update period. Accordingly, the CDR circuit (e.g., 300, 600, 650, 700) of the present invention employs an exemplary anti-glitch circuit 900 to spread out an overall larger phase correction into a series of sequential partial phase correction outputs. Anti-glitch circuit 900 may be located within or integral to the finite state machine (e.g., FSM 712), or may be operably coupled to the output of the FSM.

Circuit 900 is operable as a programmable delay circuit employed as a 32 bit thermometer code decoder and an ADC. Circuit 900 comprises a number (e.g., 4) of banks 905 of a plurality (e.g., 8) of cascade wired delay elements 910 (see FIG. 9B). The delay elements 910 are selected by a rate decoder 915 that is tied to the data rate 920 or to the desired step size as dictated by CDR bandwidth or tracking capability requirements, and operate to distribute a larger phase correction into a series of partial phase correction outputs sequentially and evenly disposed. In this way smooth or gradual phase correction is provided by the phase interpolator after a single update while preventing missing or distorted clocks signals and providing an improved tracking capability. The series of partial phase correction outputs will be further described and illustrated in association with FIG. 11.

Anti-glitch circuit 900, supports taking multiple steps of 1, 2, 4, or 8 steps 922 simultaneously. When it is required that circuit 900 take more than a single step, several of the input signals, designated as TC 925 on the 32 bit TC bus TC<31:0> 930, would toggle at once. Circuit 900 staggers the output control signals TC_OUT<31:0> 935 from the delay elements 910 such that no more than one delay element 910 is switched at any instant, as illustrated by the waveform plot 1100 of the input 1110 and outputs 1120 of FIG. 11. For example, suppose TC<0:7> simultaneously switch from a LOW to a HIGH state. When this occurs, circuit 900 would first toggle TC<0>, then after several gate delays, TC<1>, then several more gate delays and TC<2>, etc. If only a single step is taken, then the input is directly passed to the output TC_OUT<31:0> 935 through a mux 1010 as illustrated in the delay cell 1000 of FIG. 10.

Rate decoder 915 of FIG. 9A, for example, decodes the data rate 920 into step selection and control signals 940 for selection of the banks 905, each containing 8 delays (e.g., 910 or 1000). For this case, there are a total of 32 control signals 935 that select which output phase of the VCO is selected. It supports stepping through these phases at 1, 2, 4, or 8 steps 922 at a time. To accomplish the staggering of the output for taking either 1, 2, 4, or 8 steps at a time, the delay elements are wired in a cascade fashion (e.g., cascade wiring 945) such that the output of one delay 910 (e.g., TC_OUT<0> of XDLY0 of circuit portion 902) is made available to a TC_PRIOR input of another delay 910 (e.g., wiring 945 from TC_OUT<0> of XDLY0 to TC_PRIOR input of XDLY1 of circuit portion 902). When more than one step is taken, for example, two such delays would be selected and cascade coupled when two steps are required, four delays cascade coupled for four steps at a time, and so on. It is further anticipated that the delay mechanism of circuit 900 may be accomplished in an alternate implementation.

The anti-glitch circuit 900 of FIG. 9A is ideally suited to be implemented together in the same CDR circuit with the programmable divider of the present invention, as the data rate/mode selection for the divider ratio is readily matched in BW to that of the steps decode selection of the anti-glitch circuit. As an unexpected consequence, several of the FSM functions may be employed in the anti-glitch circuits (e.g., FIGS. 9 and 10) for matching the BW of the circuits and for evenly distributing the partial phase corrections. As a result, the exemplary anti-glitch circuit described may be integrated into the FSM, herein referred to as an anti-glitch/FSM circuit, for overall circuit economy and/or power savings.

Figure 11:
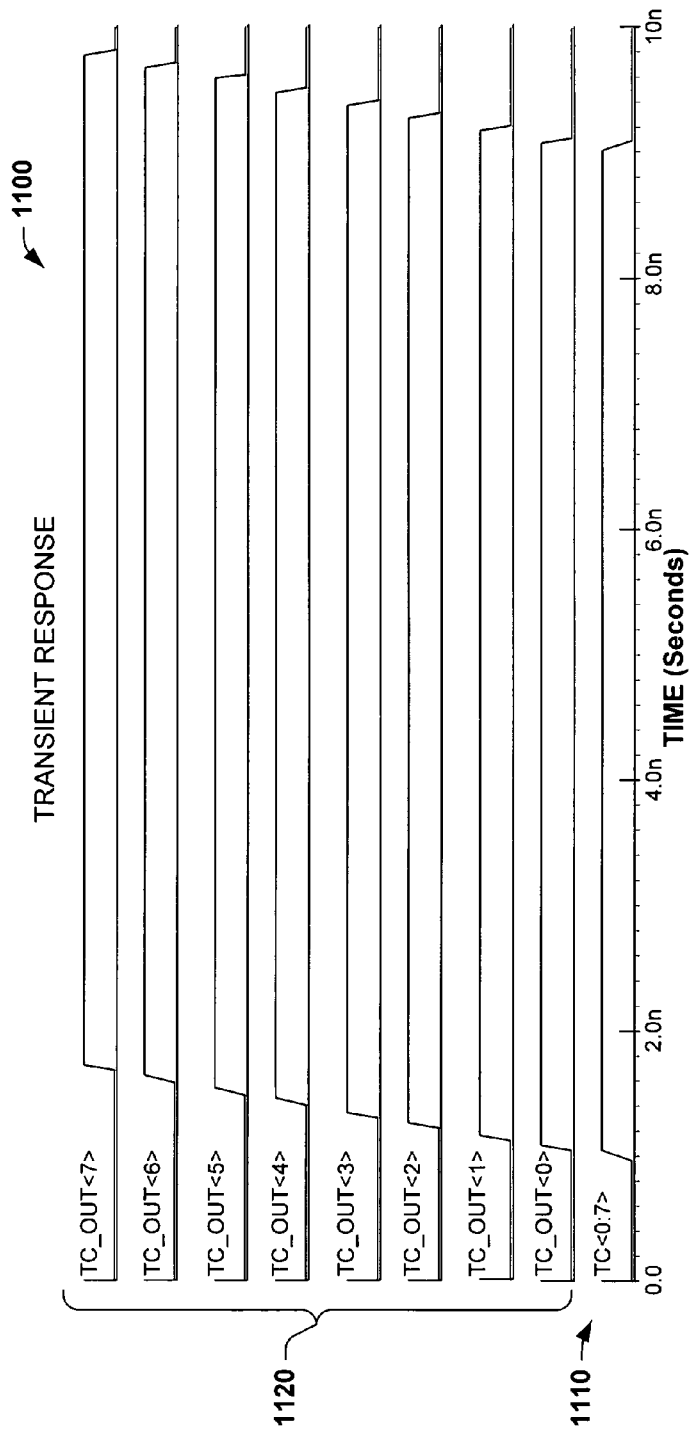
FIG. 11 is a plot illustrating an input and eight cascaded output responses of an exemplary eight delay element anti-glitch circuit of FIGS. 9A and 9B, wherein eight phase correction steps per update are provided in accordance with an aspect of the present invention.

FIG. 11 illustrates the impact of the implementation of the present invention and the waveform response 1100 of circuit 900 when 8 steps are taken, illustrating the spaced enabling and disabling of the control signals at the output TC_OUT<0:7> 1120 (e.g., TC_OUT<31:0> 935). When input TC<0:7> 1110 is received to the anti-glitch circuit 900, together with a chosen data rate (e.g., 920) a series of partial phase correction outputs TC_OUT<0:7> 1120 are produced sequentially and evenly disposed as illustrated in plot 1100.

FIGS. 12A and 12B illustrate plots of the transient response of a CDR circuit when 8 steps are taken simultaneously using the exemplary anti-glitch circuit 900 implementation of the present invention.

FIGS. 12C and 12D, by contrast, illustrate plots of the transient response of a CDR circuit when 8 steps are taken simultaneously without using the exemplary anti-glitch circuit 900 implementation of the present invention.

In each of the pairs of contrasting plots, the upper plot illustrates on the "Y" axis the voltage of the differential clock signals at the phase interpolator output represented as CLK/CLKZ with time in nanoseconds on the "X" axis. The lower of the plot pairs illustrates on the "Y" axis the voltage of an exemplary TC_OUT<0> signal with time in nanoseconds on the "X" axis. FIGS. 12B and 12D illustrate a narrower time scale to further contrast the effects to the clock signal with and without the anti-glitch/FSM circuit functional capabilities. Transition points A-B in FIGS. 12C and 12D, illustrate one such problem area and the distortion produced in the CLK/CLKZ signal without the use of the anti-glitch/FSM circuit (e.g., 712) of the present invention.

In addition, FIGS. 12A and 12B illustrate a smooth transition of the CLK/CLKZ signal 1210 between the start of the 8 step sequence 1215 and the end of the sequence of partial phase correction steps 1216 as generally outlined by the TC_OUT<0> signal 1220. By contrast, without the anti-glitch/FSM circuit (e.g., 712) of the present invention, as illustrated in FIGS. 12C and 12D, there is an abrupt transition in the CLK/CLKZ signal 1250 between the start of an 8-step correction 1255 and the end of the 8-step correction 1256 as generally outlined by the TC_OUT<0> signal 1260.

Figure 13:
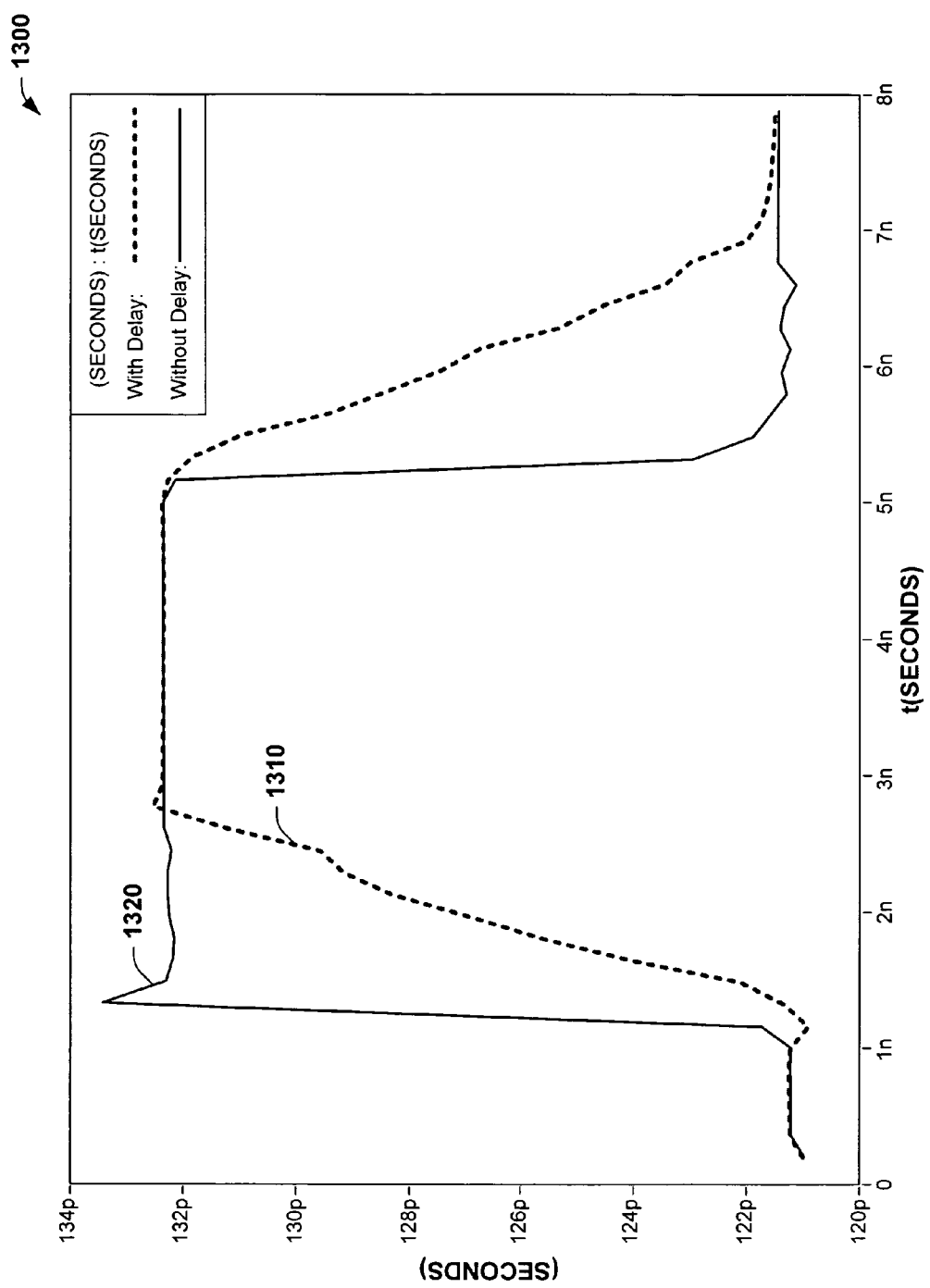
FIG. 13 is a plot of the phase change response of the output clocks of an exemplary CDR circuit with and without the implementation of the present invention.

FIG. 13 illustrates a plot 1300 of the phase of the output clocks with and without the solution of the present invention. Plot 1300 of FIG. 13 illustrates time in picoseconds on the "Y" axis of the phase of the output clocks from the phase interpolator plotted against time in nanoseconds on the "X" axis as 8 steps are taken to first delay the phase then 8 steps are taken to then advance the phase back to its original position. The plot conveys a sense of the rate of change of the phase correction similar to the 8 simultaneous step comparison of FIGS. 12A-12D in association with the implementation of the present invention. The dashed line plot 1310 illustrates the phase response when 8 steps are taken simultaneously with the solution of the present invention for one particular implementation, while solid line plot 1320 illustrates the phase response when 8 simultaneous steps are taken without the solution of the present invention. Again, the case without the present invention indicates problems with overshooting the correction of the desired output phase.

Thus, the number of steps/update and the latency is made programmable in accordance with the present invention to maintain the bandwidth as the data rate changes. This provides support for asynchronous systems for multiple data rates.

Further, the update signals to the phase interpolator are timed properly by spreading the updates over a longer period, to assure stability in the output of the phase interpolator and improve the tracking capability. By contrast, without this solution, if a phase interpolator is operating at 6.25 GHz, the output clock period is 160 ps with high and low pulse widths of 80 ps. If this period is divided into N=128 steps, each step corresponds to 1.25 ps. To advance the clock 1 step requires a pulse width of 80-1.25=78.75 ps. However, to advance the clock 8 steps requires a pulse width of 80-8*1.25=70 ps. This large of a step requires a higher bandwidth to be properly passed through the interpolator. The result of this tends to be a smaller output swing and a shifted common-mode for the pulse immediately following the update. This change in output levels can adversely impact both the amplitude and delay of subsequent circuits. In addition, the linearity of the phase interpolator step size tends to suffer if large steps are taken simultaneously. Finally, the interpolator output phase may also suffer from overshoot from the accumulation of these effects.

Figure 14:
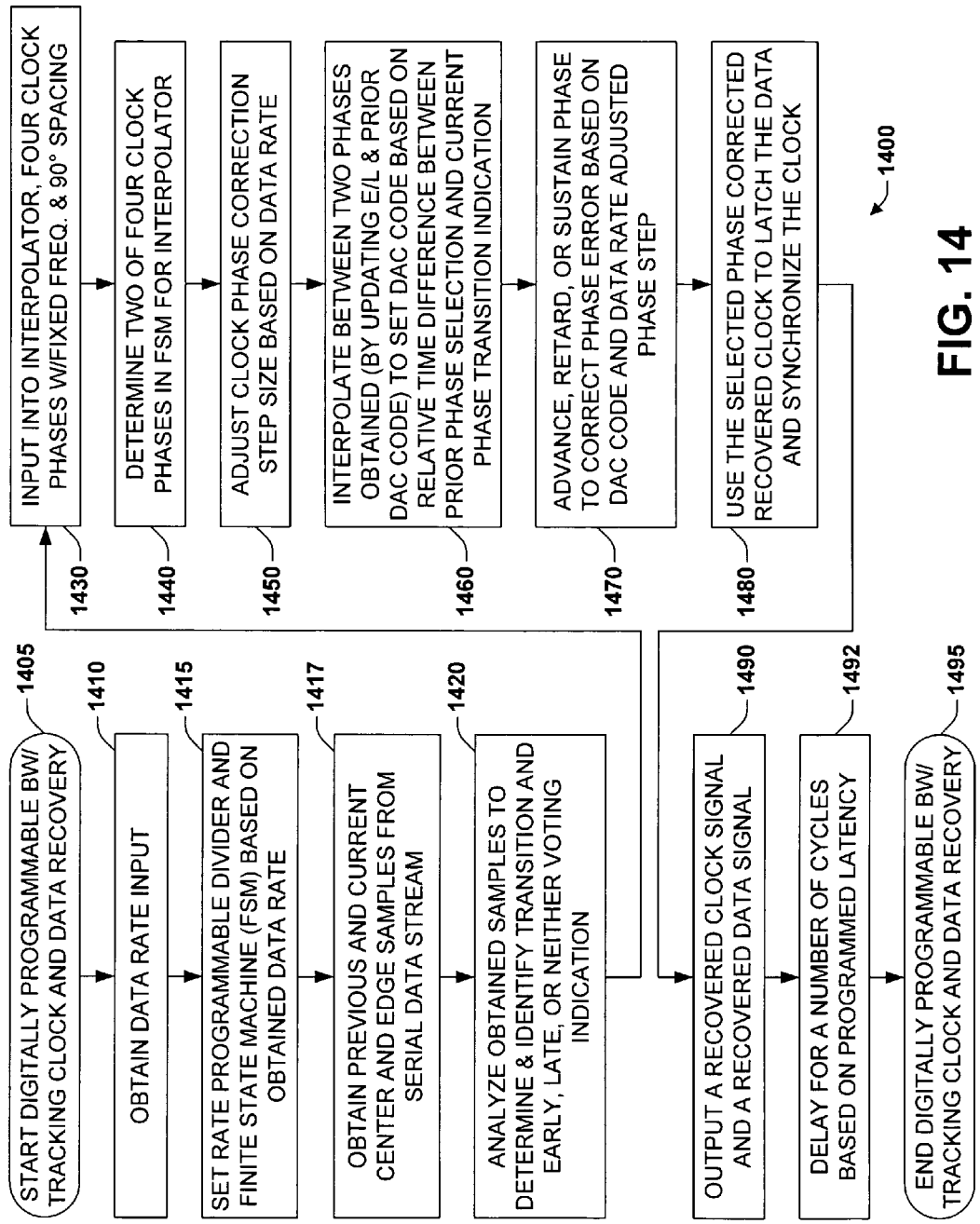
FIG. 14 is a flow diagram illustrating a method of clock and data recovery using a CDR circuit having a digitally programmable bandwidth and tracking capability in accordance with an aspect of the present invention.
Figure 15:
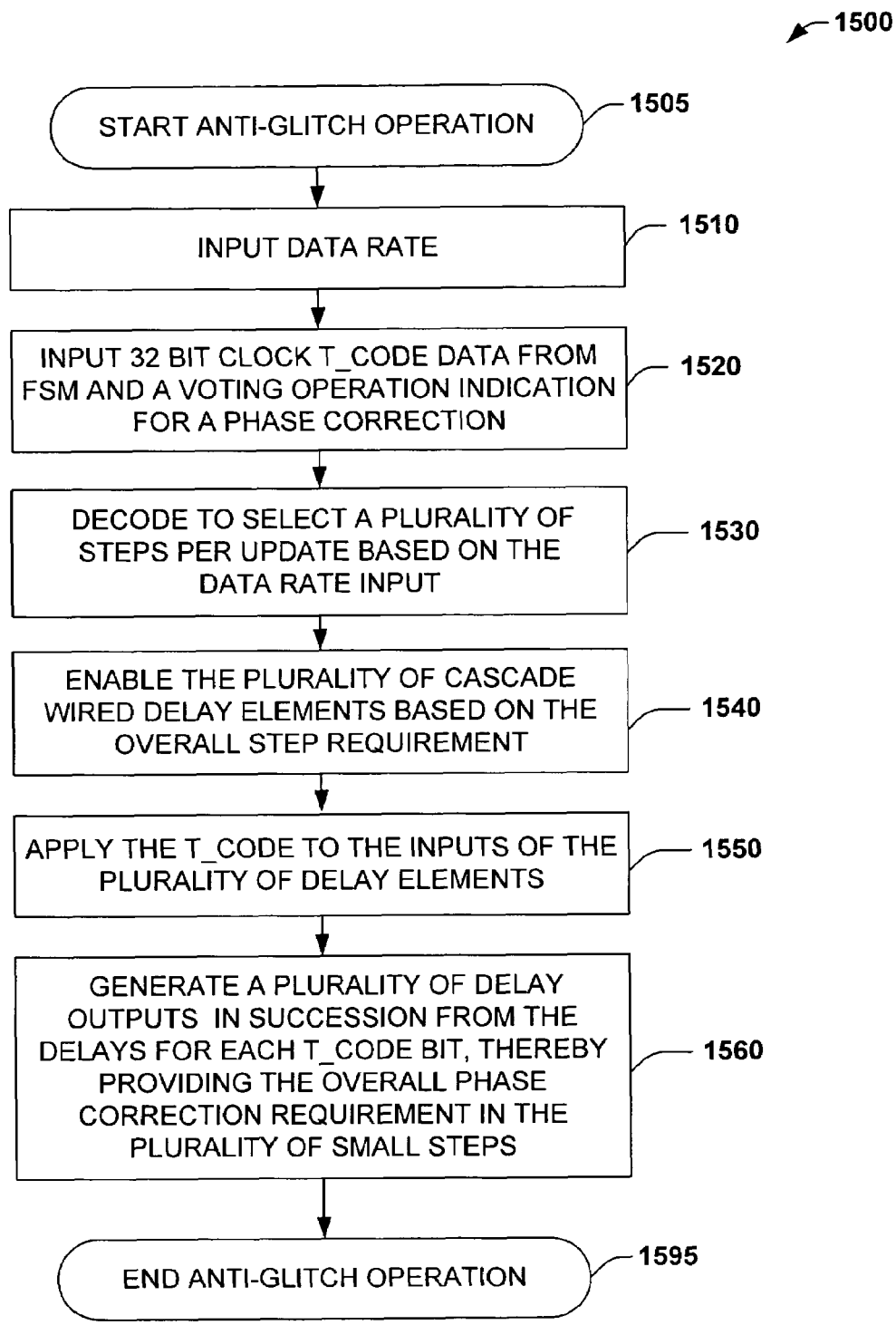
FIG. 15 is a flow diagram illustrating a method of preventing clock glitching during an interpolator update in accordance with an aspect of the present invention.

In view of the foregoing structural and functional features described supra, methodologies in accordance with various aspects of the present invention will be better appreciated with reference to the above figures. While, for purposes of simplicity of explanation, the methodologies of FIG. 14-15 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 14 is a flow diagram illustrating a method 1400 of clock and data recovery using a CDR circuit having a digitally programmable bandwidth and tracking capability in accordance with an aspect of the present invention.

Method 1400 begins at block 1405. Thereafter at 1410, a data rate is input and used as the basis to manually or automatically set a divide ratio of a programmable divider and a number of steps input of a finite state machine (FSM) within the CDR circuit at block 1415 to establish a bandwidth of the circuits based on the data rate.

At 1415 the data rate is used as the basis to manually or automatically set a divide ratio of a programmable divider and a number of steps input of a finite state machine (FSM) within the CDR circuit to establish a bandwidth of the circuits based on the data rate.

At 1417, samples of a received serial data stream are obtained for a previous and a current center sample, and current transition sample. The three samples cover a single bit time. FIGS. 3B, 4 and 5, discussed supra, illustrate points at which samples can be obtained from a received serial data stream.

At 1420, the previous center sample, the current transition sample, and the current center sample are analyzed to determine if a transition has occurred and whether an early, late, or no change voting indication is required. A plurality of clock phases (e.g., four phases with a fixed frequency) equally spaced around 360 degrees, are input at 1430. Two of the plurality of clock phases are selected based on the voting operation indication at 1440 (e.g., within the FSM for the phase interpolator). At 1450 the clock phase correction step size is adjusted (selected) based on the data rate input. An interpolation between the two phases is obtained (e.g., using a DAC and mixer in the phase interpolator) based on the two selected clock phases and the DAC code outputs of the FSM at 1460. At 1470 the phase is corrected using the interpolation and the step size selection based on the data rate.

Further, method 1400 may include latching the data and synchronizing the clock with the corrected clock phase at 1480, and outputting a recovered clock signal and a recovered data signal at 1490. At 1492, the method may further provide some number of cycles delay based on the programmed latency.

Thereafter, method 1400 ends at 1495, and may be repeated for other bit times and update periods to program the bandwidth and tracking in clock and data recovery operations.

FIG. 15 is a flow diagram illustrating a method 1500 of preventing clock glitching during an interpolator update in accordance with an aspect of the present invention. The method may be employed by a clock and data recovery system that employs an interpolator and a finite state machine.

Method 1500 begins at block 1505. Thereafter at 1510, a data rate is input 920 and a voting operation indication for a required phase correction (e.g., a 32 bit thermometer code is obtained from an FSM) is input. At 1530, a plurality of partial phase corrections (steps) for the required phase correction is decoded and selected based on a step size requirement from the data rate. At 1540, a plurality of partial phase corrections for the required phase correction are decoded and selected (e.g., using a plurality of cascade wired delay elements 910) based on the received data rate. At 1550 a plurality of delay elements corresponding to the plurality of partial phase corrections is enabled in response to the required phase correction. At 1560 a plurality of successive partial phase corrections is generated during an interpolator update to provide the required phase correction.

Thereafter, method 1500 ends at 1595, and may be repeated for other bit times and update periods to prevent interpolator update glitching in clock and data recovery operations.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A clock recovery device comprising:
   a data rate input;
   an input data sampler that obtains samples of a serial data stream;
   an early/late voting logic that identifies early and late operation for a set of bit times of the serial data stream from the obtained samples;
   a finite state machine operable to receive the data rate input for bandwidth control of the finite state machine and the early and late operation indication, and select two clock phases from identified operations of the voting logic and generates interpolator control signals to selectively mix these two clock phases;
   a phase interpolator operable to select a clock phase output that is generated from the two selected clock phases received from a clock input, wherein the phase interpolator selects the clock phase output based on the interpolator control signals from the finite state machine; and
   a programmable divider that divides the clock phase output of the phase interpolator based on the received data rate to program the device to operate at one of a plurality of clock and data rates, bandwidths, or tracking capabilities.

2. The device of claim 1, further comprising a rate/mode control circuit operable to receive the data rate input and program a divide ratio of the programmable divider and to control the bandwidth of the finite state machine.

3. The device of claim 1, further comprising a frequency detection control circuit operable to automatically detect the clock or data rate and program a divide ratio of the programmable divider and to control the bandwidth of the finite state machine.

4. The device of claim 1, wherein the bandwidth of the clock recovery device can be controlled by selecting multiple phase updates from the phase interpolator.

5. The device of claim 1, wherein the finite state machine comprises a decode circuit and a plurality of delay elements operable to selectively determine the quantity of phase correction steps per update based on a function of the data rate input, and to connect the delay elements in a configuration to provide the required steps.

6. The device of claim 1, wherein the programmable divider comprises a plurality of dividers connected to a multiplexor, the dividers each having a fixed divide ratio, the multiplexor configured to select an output of one of the dividers based on a function of the data rate input to provide a programmable data rate and a substantially fixed device bandwidth.

7. The device of claim 6, wherein a portion of the plurality of fixed dividers are serially connected to each other and to the multiplexor, the multiplexor configured to select the output of one of the dividers based on a function of the data rate input to provide a programmable data rate and a substantially fixed device bandwidth.

8. The device of claim 1, wherein the programmable divider functionally resides after the phase interpolator.

9. The device of claim 1, wherein the programmable divider functionally resides between the phase interpolator and the input data sampler.

10. A method of clock recovery comprising:
    receiving a data rate input;
    obtaining samples of a received serial data stream for a set of consecutive bit times according to a data clock and a transition clock;
    setting a programmable divider rate and finite state machine bandwidth based on the received data rate;
    analyzing the set of consecutive bit times to identify early, late, and neither conditions of the clock within the respective consecutive bit times according to the obtained samples;
    inputting a plurality of clock phases;
    determining two of the plurality of clock phases based on the identified early, late or neither clock condition;
    adjusting a clock phase correction step size based on the data rate;
    interpolating between the two determined clock phases based on a relative time difference between a prior and current phase transition indication; and
    correcting a clock phase error according to the adjusted step size.

11. The method of claim 10, further comprising:
    latching the data and synchronizing the clock with the corrected clock phase.

12. The method of claim 11, further comprising:
    outputting a recovered clock signal and a recovered data signal.

13. The method of claim 10, wherein inputting a plurality of clock phases comprises inputting a plurality of clock phases with fixed frequency.

14. The method of claim 10, wherein obtaining samples comprises sampling the received serial data stream on rising transitions of a data clock.

15. The method of claim 10, wherein obtaining samples comprises sampling the received serial data stream on rising transitions of a transition clock.

16. The method of claim 10, wherein analyzing the set of consecutive bit times to identify late operation(s) comprises identifying a transition between a current transition sample and a previous center sample for each bit time.

17. The method of claim 10, wherein analyzing the set of consecutive bit times to identify early operation(s) comprises identifying a transition between a current transition sample and a current center sample for each bit time.

18. A method of preventing interpolator update glitching comprising:
- receiving a data rate input, and a voting operation indication for a required phase correction;
- decoding and selecting a plurality of partial phase corrections for the phase correction based on the received data rate;
- enabling a plurality of delay elements corresponding to the plurality of partial phase corrections in response to the required phase correction; and
- generating a plurality of successive partial phase corrections during an interpolator update to provide the required phase correction.

19. The method of claim 18, wherein the decoding and selecting a plurality of partial phase corrections comprises decoding a 32 bit thermometer code of delay elements to provide 32 partial phase correction steps in a sequential string.

* * * * *